(12) United States Patent
Engstrom et al.

(10) Patent No.: US 7,829,150 B2
(45) Date of Patent: *Nov. 9, 2010

(54) GROWTH OF INORGANIC THIN FILMS USING SELF-ASSEMBLED MONOLAYERS AS NUCLEATION SITES

(75) Inventors: James R. Engstrom, Ithaca, NY (US); Aravind S. Killampalli, Beaverton, OR (US); Paul F. Ma, Santa Clara, CA (US)

(73) Assignee: Cornell Research Foundation, Inc., Ithaca, NY (US)

( * ) Notice: Subject to any disclaimer, the term of this patent is extended or adjusted under 35 U.S.C. 154(b) by 1026 days.

This patent is subject to a terminal disclaimer.

(21) Appl. No.: 11/155,453

(22) Filed: Jun. 17, 2005

(65) Prior Publication Data

US 2006/0003438 A1   Jan. 5, 2006

Related U.S. Application Data

(60) Provisional application No. 60/580,545, filed on Jun. 17, 2004.

(51) Int. Cl.
*B05D 1/36*   (2006.01)
*B05D 7/00*   (2006.01)
*C23C 16/00*  (2006.01)

(52) U.S. Cl. ............... 427/419.1; 427/402; 427/255.4; 427/255.6

(58) Field of Classification Search ........... 427/402, 427/419.1, 255.4, 255.6
See application file for complete search history.

(56) References Cited

U.S. PATENT DOCUMENTS

| 4,539,061 | A  |   | 9/1985 | Sagiv |
| 4,735,702 | A  | * | 4/1988 | Reinhoudt et al. ........... 204/16 |
| 4,992,300 | A  | * | 2/1991 | Ogawa et al. ............... 427/488 |
| 6,755,953 | B2 | * | 6/2004 | Baba .......................... 205/74 |
| 2002/0098346 | A1 | * | 7/2002 | Yitzchaik .................... 428/339 |
| 2005/0042888 | A1 | * | 2/2005 | Roeder et al. ............... 438/780 |

FOREIGN PATENT DOCUMENTS

EP   0598361   5/1994

* cited by examiner

*Primary Examiner*—Elena T Lightfoot
(74) *Attorney, Agent, or Firm*—Marjama Muldoon Blasiak & Sullivan LLP

(57) ABSTRACT

Systems and methods for preparing inorganic-organic interfaces using organo-transition metal complexes and self-assembled monolayers as organic surfaces. In one embodiment, a silicon wafer is cleaned and reacted with stabilized pirhana etch to provide an oxide surface. The surface is reacted with the trichlorosilyl end of alkyltrichlorosilanes to prepare self assembling monomers (SAMs). The alkyltrichlorosilanes have the general formula R1-R—$SiCl_3$, where R1 is —OH, —$NH_2$, —COOH, —SH, $COOCH_3$, —CN, and R is a conjugated hydrocarbon, such as $(CH2)_n$ where n is in the range of 3 to 18. The functionalized end of the SAM can optionally modified chemically as appropriate, and is then reacted with metal-bearing species such as tetrakis(dimethylamido)titanium, $Ti[N(CH_3)_2]_4$, (TDMAT) to provide a titanium nitride layer.

11 Claims, 19 Drawing Sheets

-OH SAM

-NH₂ SAM

-CH₃ SAM 50 nm

GROWTH OF INORGANIC THIN FILMS USING SELF-ASSEMBLED MONOLAYERS AS NUCLEATION SITES

CROSS-REFERENCE TO RELATED APPLICATIONS

This application claims priority to and the benefit of U.S. provisional patent application Ser. No. 60/580,545, filed Jun. 17, 2004, which application is incorporated herein by reference in its entirety.

STATEMENT REGARDING FEDERALLY FUNDED RESEARCH OR DEVELOPMENT

The invention described herein was made in the performance of work under the National Science Foundation (NSF) contract, under Grant Nos. 0210693 and 0079992. The Government has certain rights in the invention.

FIELD OF THE INVENTION

The invention relates to systems and methods for preparing thin films in general and particularly to systems and methods that employ self-assembling monolayers as a component of the process.

BACKGROUND OF THE INVENTION

Inorganic-organic interfaces, owing to their unique chemical and electronic properties, are playing an increasingly important role in several technologies including organic light emitting diodes (OLEDs) molecular electronics and microelectronic interconnect technology: e.g. interfaces between carbon-based low-κ dielectrics and metallic/inorganic diffusion barriers. Despite their importance, many aspects of the formation of these interfaces are not fully understood.

Self-assembly is a popular method for making highly ordered (over nm length scales), organic monolayer films on metallic and semiconductor substrates. These self-assembled organic-on-inorganic monolayers (SAMs) have been widely studied as model surfaces owing to their ease of formation and self-limiting growth characteristics. For example, alkyltrichlorosilane SAMs on silicon dioxide are formed by spontaneous reaction, adsorption and organization of a long chain molecule on the $SiO_2$ surface, e.g. $(-O-)_3Si-(CH_2)_nX$, where typically $n \geq 8$. The specificity of the reaction chemistry leaves the functional group, X, at the surface, enabling the tailoring of surface properties. These features of SAMs have made them the preferred method for tailoring the surface chemistry of inorganic surfaces.

"Inorganic-on-organic" interfaces are also important, in particular, in applications such as barrier layers (e.g. encapsulation of the aforementioned metallic interconnects), reflective coatings, and electrical contacts for both OLEDs and molecular electronics. Formation of these interfaces, however, is much less mature in comparison to "organic-on-inorganic" interfaces constructed using SAMs. To date, the inorganic component of the interface has been a metal or an oxide formed by (elemental) evaporation in vacuum, or by deposition in the liquid phase using a metal complex.

Formation of $TiO_2$ thin films on SAMs by deposition through the liquid phase has attracted recent interest. Sukenik and coworkers established a route to the synthesis of polycrystalline $TiO_2$ thin films by reacting $TiCl_4$ and $Ti(OCH(CH3)2)4$ with alkyltrichlorosilane self-assembled monolayers bearing sulfonate and —OH functional groups respectively. Zhongdang et al. deposited TiO2 thin films from the reaction of TiCl4 with sulfonate terminated trimethoxysilane SAMs on soda glass substrates, and found Ti2+, Ti3+ and Ti4+ oxidation states in the deposited film. More recently, Niesen et al. formed TiO2 thin films from the reaction of aqueous titanium peroxide solutions with trichlorosilane SAMs with different terminal groups. They found that sulfonate terminal groups assisted in the formation of densely packed films while hydroxyl and amine terminal groups led to the formation of large islands (70-200 nm in size), which eventually coalesced into a thin film possessing distinct domains. Masuda et al. obtained site-selective deposition of TiO2 from TiCl4 and Ti(OC2H5)2Cl2 onto silanol regions created in octadecyltrichlorosilane (OTS) SAMs by UV exposure. However, deposition was not restricted to the silanol regions for 3-aminopropyltriethoxysilane (APTES) and phenyltrichlorosilane (PTCS) SAMs, which was attributed to disorder introduced by the bulky phenyl group for the PTCS SAM, and the adsorption of water on the APTES SAM. XPS revealed that the TiO2 films that were formed had significant carbon and chlorine contamination.

Vapor phase evaporative deposition of elemental metals on functionalized SAMs has also been studied. Jung and Czanderna have examined the evaporation of elemental metals onto SAMs with different organic functional end groups (OFGs). They broadly categorized the metal/OFG interactions to be .strong. (e.g. Cr/COOH or Cu/COOH) where the deposit was found to reside primarily on top of the SAM (linked to the OFGs) or .weak. (e.g. Cu/OH, Cu/CN, $Ag/CH_3$, Ag/COOH) where the metal was found to penetrate the SAM and was bound at the SAM/substrate interface. Allara and co-workers used XPS to study interfacial chemistry and film morphology in situ during elemental evaporation of Ti on alkanethiol SAMs with different terminal groups. Elemental Ti was found to be highly reactive with the —OH, —CN, and —$COOCH_3$ terminal groups, first forming $TiO_x$ and $TiN_x$ species at low coverages, while formation of $TiC_x$ species, possibly due to reaction with the SAM backbone, was apparent at higher coverages. These reactive end groups on the SAM yielded smaller islands and thin films with smaller roughness when compared to SAMs with less reactive end groups (i.e. —$CH_3$), where significant 3-D growth was observed. Allara and co-workers also studied the reaction of vapor deposited aluminum with —$CH_3$, —$COOCH_3$ and —COOH terminated alkanethiol self-assembled monolayers on polycrystalline gold. While significant penetration of Al to the SAM/Au interface was observed for the —$CH_3$ terminated SAM, reaction of Al with the —$COOCH_3$ and —COOH terminated SAMs was confined to the SAM/vacuum interface.

The deposition of thin inorganic films on SAMs using organometallic precursors has received relatively less attention. The formation of Au, Pd and Al thin films by the reaction of organometallic precursors on SAMs has been examined. In the case of Au and Pd deposition on thiol-based SAMs, only spatial selectivity and thin film morphology were examined. For Al deposition from trimethylaminealane on —OH, —COOH and —$CH_3$ terminated thiol SAMs, interfacial chemistry was examined using XPS, but an explicit examination of the kinetics of adsorption was not attempted.

There is a need for systems and methods that provide better control of the preparation and composition of thin-film inorganic materials.

SUMMARY OF THE INVENTION

In one aspect, the invention relates to a method of making a self-assembled monolayer having an inorganic-organic interface. The method comprises the steps of providing a substrate having a surface; reacting the substrate surface with a precursor organic molecular species to form a self-assembled monolayer of the organic molecular species on the substrate, the organic molecular species when attached to the surface having an end proximal to the surface and an end distal to the surface; and reacting at the distal end at least a portion of the self assembled monolayer of the organic molecular species with a reagent comprising a metal and nitrogen. A self-assembled monolayer comprising an organic moiety and a metal nitride surface is produced.

In some embodiments, the precursor organic molecular species is in solution. In some embodiments, the precursor organic molecular species is in the vapor phase. In one embodiment, the substrate is a silicon substrate. In one embodiment, the method of making a self-assembled monolayer having an inorganic-organic interface further comprises the optional step of treating the surface of the substrate to provide a surface having a desired chemical composition. In one embodiment, the surface having a desired chemical composition is an oxide surface. In one embodiment, the method of making a self-assembled monolayer having an inorganic-organic interface further comprises the optional step of reacting at least some of the self-assembled monolayer of the organic molecular species with a reagent to provide a desired terminal group on the distal end of the at least some of the organic molecular species. In one embodiment, the optional reaction step comprises forming a terminal —OH, —NH$_2$, or —CH$_3$ group on the distal end of the at least some of the organic molecular species. In one embodiment, the optional reaction step comprises forming a terminal —OH on the distal end of the at least some of the organic molecular species by providing a vinyl-terminated precursor that is treated with hydroboration followed by oxidation. In one embodiment, the optional reaction step comprises forming a terminal —NH$_2$ on the distal end of the at least some of the organic molecular species by providing a —CN-terminated precursor that is treated with hydroboration followed by reduction. In one embodiment, the optional reaction step comprises forming a terminal group selected from a carboxylic acid, a mercapto group, an ester, an aldehyde, and a nitro group on the distal end of the at least some of the organic molecular species.

In another aspect, the invention features a self-assembled monolayer having an inorganic-organic interface supported on a substrate having an oxide surface. The self-assembled monolayer having an inorganic-organic interface supported on a substrate having an oxide surface comprises a monolayer of an organic molecular species having an end proximal to the surface and an end distal to the surface; and a moiety comprising a metal and nitrogen at the distal end of at least a portion of the monolayer of the organic molecular species.

In one embodiment, the self-assembled monolayer having an inorganic-organic interface supported on a substrate having an oxide surface further comprises an optional desired terminal group attached to the distal end of at least some of the organic molecular species. In one embodiment, the self-assembled monolayer having an inorganic-organic interface supported on a substrate having an oxide surface further comprises a hydrocarbon moiety having a chain length between the proximal end of the organic molecular species.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION OF THE INVENTION

Figure 1:
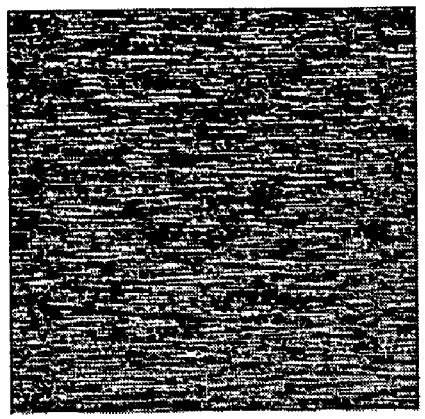
FIG. 1 is a diagram showing micrographs obtained using AFM for the —OH, —NH$_2$ and —CH$_3$ terminated SAMs, according to principles of the invention.
Figure 1:
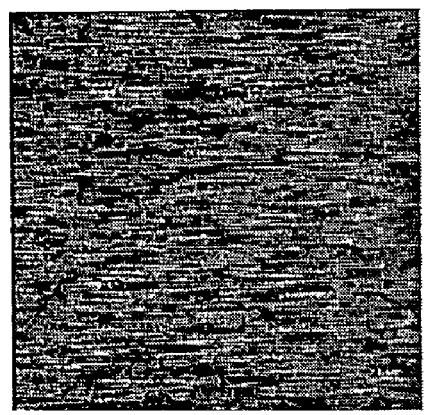
Figure 1:
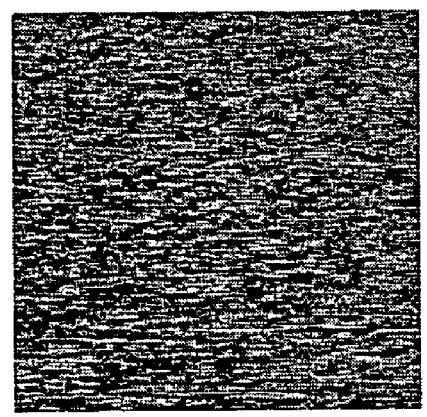

The present invention relates to methods and systems for preparing inorganic thin films using a self-assembled monolayer (also referred to herein as a "SAM") on a substrate of interest, such as a silicon wafer, or a carbon-based structure. In some embodiments, self-assembled monolayers can provide nucleation sites for the reaction that produces the thin film. Some self-assembled monolayers comprise functionalized molecules (e.g., molecules having a selected functional group as a termination) that react preferentially with selected transition metal coordination complexes. Several examples of different self-assembled monolayers having different numbers of carbon atoms in their backbone, and having different terminal groups, such as —OH (hydroxyl), —$NH_2$ (amine), and —$CH_3$ (methyl) terminal groups, are described. In the embodiments described, one titanium metal complex was used to study chemical reactivity, the spatial extent of reaction and reaction rates. It is believed that functional groups such as —COOH (carboxylic acid), —SH (mercapto), an ester, an aldehyde, or —$NO_2$ (nitro) group will also be useful in certain chemical reactions according to principles of the invention. In the description given hereinbelow, the process of reacting the substrate with a precursor organic molecular species employs a precursor organic molecular species that is in solution. However, it is believed that it is also possible to perform such reaction using a precursor organic molecular species that is present in the vapor phase.

The adsorption and reaction of a titanium coordination compound with a number of trichlorosilane self-assembled monolayers possessing different functional endgroups has not been previously reported. The reaction of tetrakis(dimethylamido)titanium, Ti[N($CH_3$)$_2$]$_4$ (also referred to hereinafter as "TDMAT"), a precursor for deposition of thin films of titanium nitride, was performed with self-assembled monolayers (SAMs) terminated by —OH, —$NH_2$ and —$CH_3$ groups. Applications that can be enabled by the present invention include interconnect technology. In particular, titanium nitride (TiN) films have been employed as diffusion barriers in microelectronic circuits owing to their excellent chemical and thermal stability, low bulk resistivity, impermeability to the diffusion of copper and silicon and excellent adhesion to both Si and $SiO_2$. In this context, it is believed that coordination compounds will be superior to halide precursors. For example, concerning deposition of TiN on inorganic substrates, it is known that lower temperatures are required for deposition from coordination compounds, and that halide contamination is eliminated when reacted with nitrogen containing precursors. This is the first in depth report of the reaction of a transition metal complex with a set of self-assembled monolayers possessing different functional endgroups.

The reactions of Ti[N($CH_3$)$_2$]$_4$ with alkyltrichlorosilane self-assembled monolayers (SAMs) terminated by —OH, —$NH_2$ and —$CH_3$ groups was investigated with X-ray photoelectron spectroscopy (XPS). For comparison, a chemically oxidized Si surface, which serves as the starting point for formation of the SAMs, was also investigated. The features of the reaction that were examined include the kinetics of adsorption, the spatial extent of reaction, and the stoichiometry of reaction. Chemically oxidized Si has been found to be the most reactive surface examined, followed by the —OH, —$NH_2$ and —$CH_3$ terminated SAMs, in that order. Under the conditions investigated, on all surfaces the reaction of Ti[N($CH_3$)$_2$]$_4$ was relatively facile, as evidenced by a rather weak dependence of the initial reaction probability on substrate temperature (Ts=−50 to 110° C.), and adsorption could be described by first-order Langmuirian kinetics. The use of angle-resolved XPS demonstrated clearly that the anomalous reactivity of the —$CH_3$ terminated SAM could be attributed to reaction of Ti[N($CH_3$)$_2$]$_4$ at the SAM/$SiO_2$ interface. Reaction on the —$NH_2$ terminated SAM proved to be the "cleanest," where essentially all of the reactivity could be associated with the terminal amine group. In this case, approximately one Ti[N($CH_3$)$_2$]$_4$ was adsorbed per two SAM molecules. On all surfaces there was significant loss of the N($CH_3$)$_2$ ligand, particularly at high substrate temperatures, $T_s$=110° C.

In one embodiment, alkyltrichlorosilane based SAMs are generated, having the general formula R1-R—$SiCl_3$, where R1 is —OH, —$NH_2$, —COOH, —SH, $COOCH_3$, —CN, and R is a conjugated hydrocarbon, such as $(CH2)_n$ where n is in the range of 3 to 18. These SAMs are advantageous for at least the reasons that they posses good thermal stability (to 475° C. in vacuum), they possess chemical robustness (for example, they can be used as photoresists in lithography), and the there is good availability of starting materials. In one embodiment, the SAM molecule can be understood to comprise a headgroup (e.g., a chemical group that participates in a reaction by which the SAM is bound to a substrate), a backbone (e.g., a chemical moiety having a chain length or a length based upon the presence of one or more carbon-bearing molecular species), and a tailgroup (e.g., a chemical group that provides functional termination for later reaction).

Fabrication of Layers

First, self-assembled monolayers possessing the desired endgroups were formed on an appropriate substrate. In all cases, the self-assembled monolayers were formed by reacting trichlorosilanes on $SiO_2$ surfaces. In some cases, following SAM formation, the substrates were subjected to additional chemical conversion steps to form the desired organic functional endgroup. Second, and prior to insertion into vacuum, the substrates were characterized using contact angle measurements, ellipsometry and atomic force microscopy (AFM). Third, the substrates were transferred into a custom-designed ultrahigh vacuum chamber, previously described by Xia, Jones, Maity, and Engstrom (*J. Vac. Sci. Technol. A*, 1995, 13, 2651-2664), for additional analysis using XPS, and eventual exposure to the titanium coordination complex. Once in the ultrahigh vacuum chamber, XPS was used to determine the coverage-exposure relationship for TDMAT on the different SAMs, and, in selected cases, angle resolved X-ray photoelectron spectroscopy (ARXPS) was used to probe the spatial extent of reaction of the precursor.

A. Formation of the Self-Assembled Monolayers

Materials

The following chemicals were purchased from Sigma-Aldrich Corp. (St. Louis, Mo.) and used as received: hexadecane, chloroform, and carbon tetrachloride, all anhydrous and >99%; tetrahydrofuran (THF), >99%, A.C.S. reagent; 1.0 M borane-tetrahydrofuran (BH3-THF) complex; 37% hydrochloric acid, A.C.S. reagent; 30% hydrogen peroxide, A.C.S. reagent; and sodium hydroxide pellets, reagent grade. The solvents, 99% dicyclohexyl from Fisher Scientific International Inc. (Springfield, N.J.), and THF were dried using 8 mesh Drierite (W. A. Hammond Drierite Co. Ltd., Xenia, Ohio). The trichlorosilane precursors were obtained from Gelest Inc. (Morrisville, Pa.) and used as received: 11-cyanoundecyltrichlorosilane, 10-undecenyltrichlorosilane, and n-octadecyltrichlorosilane. Tetrakis(dimethylamido)titanium (TDMAT), $\geq$99.999% purity based on metals analyzed, and $\geq$99% purity based on an assay by NMR, was obtained from Schumacher (Carlsbad, Calif.). Chloroform, 99.8% HPLC grade with 50 ppm pentene, obtained from Fisher Scientific International Inc. was used to sonicate freshly cleaved silicon wafers. The following chemicals were used as received from Mallinckrodt Baker Inc. (Phillipsburg, N.J.): CMOSTM grade acetone, CMOSTM grade 2-propanol, and buffered oxide etch (BOE) (6:1 CMOSTM grade NH4F-HF aqueous solution). Nanostrip from Cyantek Corp. (Fremont, Calif.) was also used as received.

Substrate Preparation

The starting substrates were 100 mm single side polished, 500-550 μm thick Si (100) wafers, doped with boron (B) to a resistivity of 38-63 Ω-cm. The substrates were scribed with a Florod LASER 1 MEL 40 laser system and subsequently cleaved into 16 samples, each a square of 16.75×16.75 mm². After cleaving, these samples were sonicated in chloroform, washed with de-ionized (DI) water, dried with $N_2$, and then dipped in BOE for 1 min. A thin layer of silicon dioxide (so-called "chemical oxide") was grown by placing the samples in Nanostrip solution (a stabilized formulation of sulphuric acid and hydrogen peroxide) for 15 min. at 75° C. The samples were then subject to a BOE and Nanostrip treatment for a second time. This procedure consistently produces a chemical oxide on the surface with a thickness of 20-25 Å, which is fully wet by water with an advancing contact angle of 0° and a receding contact angle of 0°. This oxide has been reported to possess ~5×10$^{14}$ SiOH groups/cm². Without further processing this surface is the "chemical oxide" referred to below.

SAM Formation

All SAMs were formed by liquid phase deposition on chemical oxide. Deposition was carried out in a glove box (Unilab, M. Braun Inc.) equipped with a refrigeration unit (temperatures to −35° C.) and a nitrogen atmosphere with <1 ppm $O_2$. All glassware was rinsed repeatedly with acetone, isopropanol and DI water followed by baking at 150° C. overnight before use. The solvents used were 4:1 hexadecane:chloroform for octadecyltrichlorosilane ($Cl_3$—Si—$(CH_2)_{17}$—$CH_3$), and bicyclohexyl for 10-undecenyltrichlorosilane ($Cl_3$—Si—$(CH_2)_9$—CH=$CH_2$) and 11-cyanoundecyltrichlorosilane ($Cl_3$—Si—$(CH_2)_{11}$—CN). The solvents were chosen by taking into account their freezing point and the transition temperature (10° C. for 11 carbon chains and 28° C. for 18 carbon chains) to be maintained for the formation of well-ordered SAMs. All solutions were ~2.5 mM concentration of the SAM precursor molecule in the solvent. Substrates were dipped in the SAM solution for 1 hour for the —CH=$CH_2$ and —$CH_3$ terminated SAMs and 3 minutes for the —CN terminated SAM. Upon withdrawal from the solution, samples were sonicated in anhydrous chloroform for 10-25 min. to remove any polymerized residue, not bonded to the substrate. Finally, the substrates were washed in DI water, dried with $N_2$ and stored in precleaned fluoroware containers in a dessicator.

Formation of Terminal Groups

The vinyl terminated SAM (≡Si—$(CH_2)_9$—CH=$CH_2$) was converted to a —OH terminated SAM (≡Si—$(CH_2)_9$—$CH_2$=$CH_2$) by a 2 hour dip in 1.0 M $BH_3$-THF solution followed by a dry THF rinse, and a 2 min. dip in a 30% $H_2O_2$:0.1N NaOH solution. Samples were then washed with DI water, dried with $N_2$ and stored in precleaned fluoroware containers. This treatment has been found to convert ~97% of the vinyl groups to —OH groups for a 16 carbon SAM. The —CN terminated SAM (≡Si—$(CH_2)_{11}$—CN) was converted into an —$NH_2$ terminated SAM (≡Si—$(CH_2)_{11}$—$CH_2$—$NH_2$) by a 4 hour dip in 1.0 M $BH_3$-THF solution, followed by a 1 hour dip in methanol, and finally a 15 min. dip in 10% HCl to deprotonate the amine group. Wafers were washed with DI water, dried with $N_2$ and stored in precleaned fluoroware containers. This treatment has been found to reduce the —CN group completely.

B. Characterization of the Self-Assembled Monolayers

Contact Angle Measurements

Contact angle measurements were carried out with a NRL CA Goniometer (Rame-Hart Inc., Mountain Lakes, N.J.). Measurements were performed with an advancing droplet volume of at least 3 μL and a receding droplet volume of about 2 μL. Contact angles were measured on each side of the droplet and in five different areas on each sample, and the average of these values is reported. Typical values for the standard deviation were 2-3°.

Ellipsometry

Measurements of the thickness of the SAMs were performed with a Gaertner L-120A ellipsometer, which employs a He—Ne (632.8 nm) laser light source incident at 70° with respect to the surface normal. For the refractive indices a value of 1.46 has been reported for the chemical oxide, whereas values of 1.42-1.44 have been reported for the SAMs examined here. The latter is valid for liquid and solid straight-chain saturated hydrocarbons. Sensitivity of the calculated thickness to the value assumed for the refractive index was small. A change of 0.05 resulted in less than a 1 Å change in the estimated thickness of the monolayer. This fact allowed us to simplify the analysis. Specifically, the thickness of the chemical oxide was first measured, and subsequently the thickness of the combined chemical oxide/SAM layer was measured, assuming a refractive index of 1.46 for the composite layer. The difference between these values gives the thickness of the SAM. Measurements of this type were made in 3-5 different areas on each sample and repeated on different samples. The estimated error in these measurements is ±1 Å.

Atomic Force Microscopy (AFM)

Images were acquired with a Dimension 3100 scanning probe microscope (Veeco Instruments, Woodbury, N.Y.) in tapping mode using Tap 300 SPM probes (Nanodevices Inc., Santa Barbara, Calif.).

X-Ray Photoelectron Spectroscopy (XPS)

XPS was carried out using a VSW twin anode x-ray source (Mg/Al) and a VSW CLASS 100 concentric hemispherical energy analyzer (VSW Worldwide, Cheshire, U.K.). Mg Kα x-rays (1253.6 eV) were used throughout this study. Survey scans (e.g. 0-1300 eV kinetic energy) were carried out in the fixed retardation ratio mode, whereas detailed scans (range of ~20 eV over a single feature) were carried out in the fixed analyzer transmission mode. The emission current for the source was 20 mA and the electron voltage was 12 kV. Short scans (0.5 eV/s, 10 cycles) were used for C (1s), 0 (1s) and Si (2p) peaks. As a consequence, damage to the SAMs due to exposure to the x-rays was not manifest in the experiments reported here. The take-off angle for photoelectrons was 38.5° with respect to the surface normal for experiments examining the kinetics of adsorption. A background subtraction method first proposed by Shirley was used in all analyses of the peaks. Peak areas and peak positions were obtained by fitting the spectra to a product Gaussian-Lorentzian (G-L) function of the form:

$$f(x) = h/[1+M(x-x_0)^2/\beta^2]\exp\{1-M[(\ln 2)(x-x_0)^2/\beta^2]\}$$

where h is peak height, M is the mixing ratio or the fractional contribution of the Gaussian and Lorentzian components, $x_0$ is the peak center and $\beta$ is a parameter that is nearly 0.5 (FWHM). A value of 0.9 was used for M for all peaks. These product G-L functions have been widely used to provide good quality fits substituting for Voigt functions, which involve a convolution of a Gaussian with a Lorentzian function. Product functions also produce smaller residuals compared to sum G-L functions.

C. Study of the Reaction of TDMAT with the SAMs

UHV Apparatus

Exposure of SAM surfaces to TDMAT was carried out in a custom-designed ultrahigh vacuum system that has been described in detail by Xia, Jones, Maity, and Engstrom (*J. Vac. Sci. Technol. A,* 1995, 13, 2651-2664). A microcapillary array doser (Burle Technologies Inc., Lancaster, Pa.) made of lead silicate glass, (0.3 mm thick, 18 mm diameter of capillary area, 5 μm pore size, 6 μm center to center spacing with solid border) was used to deliver a uniform flux of TDMAT to the surface of the sample, without producing a significant rise in the background partial pressure. The doser was 25.4 mm from the center of the sample during exposures. A ¼ in. silver plated 316 SS VCR gasket with an aperture 178.8 μm in diameter and 125±25 μm long was placed upstream of the doser, and between the doser and the stainless steel vessel ("bubbler") containing the TDMAT. For most experiments, the flow was metered by controlling the temperature of the bubbler, and using the gasket as a flow-limiting orifice. Exposures were initiated by opening a bellows-sealed valve placed between the bubbler and the aperture. Exposures were shunted by condensing the TDMAT in a liquid nitrogen ("LN₂") cooled side arm placed up stream of the doser. The partial pressure vs. exposure time relationship was verified using mass spectrometry, and an initial transient caused by reversible adsorption of TDMAT on the inner surfaces of the feed line was quantified, and the exposures have been suitably adjusted.

An estimate for the absolute flux of TDMAT reaching the sample surface was made using the following procedure. First, the resistance to flow was calculated for the section of (4.57 mm i.d.) tubing between the capacitance manometer (MKS) (placed between the bubbler and the flow-limiting orifice); the flow-limiting aperture, and the capillary array. For typical conditions (measured partial pressure of TDMAT at the bubbler<0.05 Torr), we found that the flow-limiting orifice provided ~90% of the resistance to flow. Coupled with the measured partial pressure this gave a total throughput of $4.171 \times 10^{14}$ molecules/s of TDMAT entering the chamber. Second, using established correlations for the angular distribution produced by capillary array dosers, we computed the fraction of the flux that was intercepted by the sample. Accounting for the sample area and the angle of incidence gives the incident flux of TDMAT ($2.798 \times 10^{13}$ molecules/cm²s). We estimate that the variation of the (relative) flux over the area sampled by XPS was no greater than ±1.5%. A check of the calculated conductance was made using a flow of pure He, using a calibrated mass flow controller and the capacitance manometer. A check of the angular distribution produced by the capillary array doser was also made, using a (rotatable) mass spectrometer placed in a line-of-sight position and, as a reference, a nozzle consisting of a single aperture that produced an effusive flux. We estimate that the accuracy of the absolute flux is at best ±30%.

Procedures

All self-assembled monolayer films were deposited in the liquid phase and on chemical oxide, as described above. A polycrystalline Au sample (1000 Å of Au, deposited at 2 Å/s, on 100 Å of Cr, deposited at 4 Å/s, both on a Si (100) wafer with a native oxide layer at the surface) was used as reference standard for XPS. The Au and Cr thin films were deposited in a CVC SC4500 system (Cornell Nanoscale Facility) by e-beam evaporation. After XPS analysis of the Au reference standard sample [scanning the Au (4f) peak], the substrate of interest possessing a self-assembled monolayer was transferred into the ultrahigh vacuum chamber via a fast-entry load-lock. Once a base pressure of ca. $2 \times 10^{-9}$ Torr was achieved, experiments involving TDMAT were initiated. First, the sample was brought to temperature (here, either −50° C., 30° C. or 110° C.). We note in passing that for a 11 carbon undecenyltrichlorosilane SAM, annealing to above 125° C. for 2 hours in a $10^{-2}$-$10^{-3}$ Torr ambient was found to result in disordering as evidenced by water and hexadecane contact angle measurements. In addition, the 11 carbon SAM and 18 carbon OTS on $SiO_2$ have been reported to undergo disordering with a drastic increase in surface roughness from 0.4 nm to 1.5 nm and 2.0 nm respectively (from AFM) on annealing to above 140° C. in a $10^{-2}$-$10^{-3}$ Torr ambient for time periods of about 5 hours. Second, XP spectra were obtained, as described hereinbefore, to verify SAM identity, and to quantify the coverage. Next, the SAM surface was exposed to TDMAT through the doser, where exposures ranged from 45 to 390 s. After each exposure, the Ti (2p) peak was scanned, as described in detail hereinbelow, in order to quantify TDMAT adsorption on the SAM surface. Exposures and the acquisition of XP spectra were repeated until saturation of the adlayer was apparent. After saturation was attained, detailed scans of C(1s), O(1s), N(1s) and Si(2p) peaks were obtained.

X-Ray Photoelectron Spectroscopy (XPS)

In most cases the Ti(2p) and N(1s) peaks were scanned at a rate of 0.5 eV/s, and 20 consecutive spectra were acquired in the fixed analyzer transmission mode. For studies of the adsorption kinetics the take-off angle of the photoelectrons was fixed at 38.5°, and a 5 mm diameter circular spot on the sample was analyzed. For the experiments involving a variable (0°-65°) take-off angle, a $1 \times 10$ mm² rectangular slit was used to maintain maximum field of focus. All experiments involving ARXPS were conducted at Ts=110° C. Peak positions for the Ti(2p) feature were obtained in manner essentially identical to that described above. Peak areas for the Ti(2p) feature were obtained by numerical integration following a Shirley background subtraction.

Results and Discussion

A. Characterization of the Self-Assembled Monolayers: the Reactive Surface

The chemical oxide, and the three self-assembled monolayer surfaces were characterized by measurements of the contact angle, ellipsometry, AFM and XPS. Measurements of the contact angle for the chemical oxide resulted in the water droplet completely wetting the surface, with advancing angles<15° and receding angles<10° as expected. In Table 1 we present results for the three SAMs we consider here: advancing and receding angles, hysteresis, and results obtained in previous work on these same systems. As may be seen, for the —OH, —NH$_2$ and —CH$_3$ terminated SAMs, the contact angles measured here give values within the ranges reported previously. Also given in Table 1 are the thicknesses for the —OH SAM and the —CH$_3$ SAM as deduced by ellipsometry. Ellipsometric thicknesses for the chemical oxide were found to lay in the range 20-25 Å. For the —CH$_3$ SAM we found a film thickness of a 27 Å. In previous work on —CH$_3$ terminated alkyl SAMs, the film thickness, L, was found to be given by L(Å)=1.26n+4.78, where n is the number of C in the backbone. Using this formula for n=18, predicts L=27.46 Å, essentially identical to that compared to a value of 3.5 eV that has been previously reported for chemical oxide grown using an RCA clean. In addition, the Si (2p) peak for chemical oxide is at 103.2 eV (cf. 103.5 eV). An estimate for the thickness of the chemical oxide can be made from this Si (2p) feature by using known values for the inelastic mean free path of the Si(2p) photoelectrons in SiO$_2$ ($\lambda_{Si(2p),SiO2}$=31.4 Å) and Si ($\lambda_{Si(2p),Si}$=26.3 Å) . This procedure yields a value of 8 Å, which is less than that obtained from ellipsometry.

Survey XP spectra for all three SAMs gave peaks only for the following components: C(1s), 285 eV; Si(2s), 153 eV; Si(2p), 99.7 eV; O (1s), 532 eV; and N (1s), 400.6-401.2 eV (only for the .NH$_2$ SAM). No Cl was detected by XPS, indicating complete hydrolysis of the starting material, and formation of Si—O—Si bonds to the underlying substrate. Chemical conversion from vinyl termination to —OH termination was verified in two ways. First, the area of the O (1s) peak increased by 14% for the —OH SAM as compared to

TABLE 1

Properties of self-assembled monolayers*

| Surface | Contact angle | | | Thickness | Density | Roughness |
|---|---|---|---|---|---|---|
|  | advancing | receding | hysteresis | (ellipsometry) | (cm$^{-2}$, XPS) | (AFM) |
| ≡Si—(CH$_2$)$_{17}$—CH$_3$ | 112° ± 0.6° 110-112° [10] | 109.7° ± 4.7° | 2.3° | 27 Å 27.5 Å [36] | 3.09 × 10$^{14}$ 3.99 × 10$^{14}$ | 4.19 Å |
| ≡Si—(CH$_2$)$_{10}$—CH$_2$OH | 54.9° ± 1.7° 50-60° [36] | 50.4° ± 2.2° | 4.5° | 17 Å 16 Å [36] | 2.96 × 10$^{14}$ | 4.04 Å |
| ≡Si—(CH$_2$)$_{12}$—NH$_2$ | 59.4° ± 3.9° 63° ± 2.0° [40] | 47.0° ± 3.4° 42.0 ± 4.0 [40] | 12.4° 21.0° [40] |  | 4.38 × 10$^{14}$ | 4.44 Å |

*this work unless otherwise indicated
[10] Ulman, A. An Introduction to Ultrathin Organic Films, From Langmuir-Blodgett to Self-Assembly; Academic Press: Boston, 1991.
[36] Wasserman, S. R.; Tao, Y-T.; Whitesides, G. M. Langmuir 1989, 5, 1074-1087.
[40] Balachander, N.; Sukenik, C. N., Langmuir 1990, 6, 1621-1627.

measured here. For the —OH terminated SAM, the thickness was consistent with the reported value of 16 Å.

FIG. 1 is a diagram showing micrographs obtained using AFM for the —OH, —NH$_2$ and —CH$_3$ terminated SAMs. These are representative micrographs; similar images were obtained at different spots on each sample. All images represent 250×250 nm$^2$ scans, and were acquired in tapping mode. As may be seen, in all cases the images indicate a very uniform monolayer, with no evidence of large (several nm$^2$) defects in the adlayer. We should note, however, that AFM will not be effective in detecting defects such as grain boundaries, and isolated defects occupying only a few nm$^2$. Root mean square (RMS) surface roughness is ~4 Å for all the three SAMs examined here (cf. Table 1). The roughness of underlying chemical silicon dioxide measured by AFM is 3.02 Å, thus, the SAMs appear to uniformly cover the underlying substrate.

Figure 2:
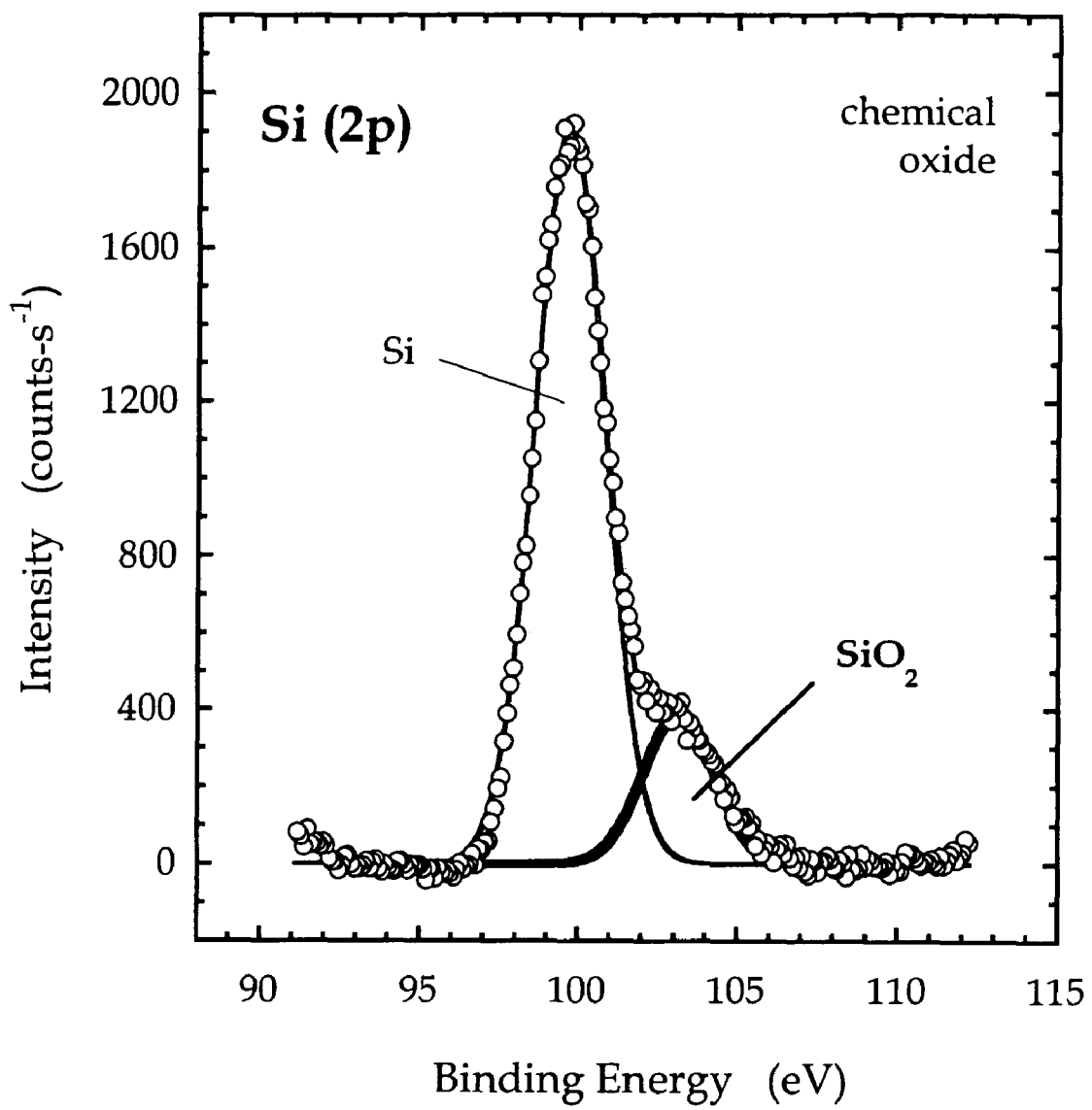
FIG. 2 is a diagram that shows the Si (2p) spectrum for the chemical oxide, according to principles of the invention.

X-ray photoelectron spectra were acquired for all four reactive surfaces examined here. The survey spectrum for chemical oxide showed three elements: silicon (2s, 153 eV; 2p, 99.7 eV), O (is, 532 eV) and C (is, 285 eV). FIG. 2 is a diagram that shows the Si (2p) spectrum for the chemical oxide. The spectrum has been fit to two peaks (at 99.7 and 103.16 eV) as described in the text, and these are indicated by the smooth curves. As may be seen, there is a shoulder on the high binding energy side of the Si (2p) peak that is from the SiO$_2$ thin film. Analysis of this spectrum, fitting the Si(2p) feature to two peaks of equal FWHM gives a chemical shift of 3.46 eV for the peak associated with SiO$_2$, which can be that observed for the underlying substrate (chemical oxide). The second observation involves the C(1s) peak, described in more detail hereinbelow. Chemical conversion of the —CN group to —NH$_2$ could be verified by examining the N(1s) peak.

Figure 3:
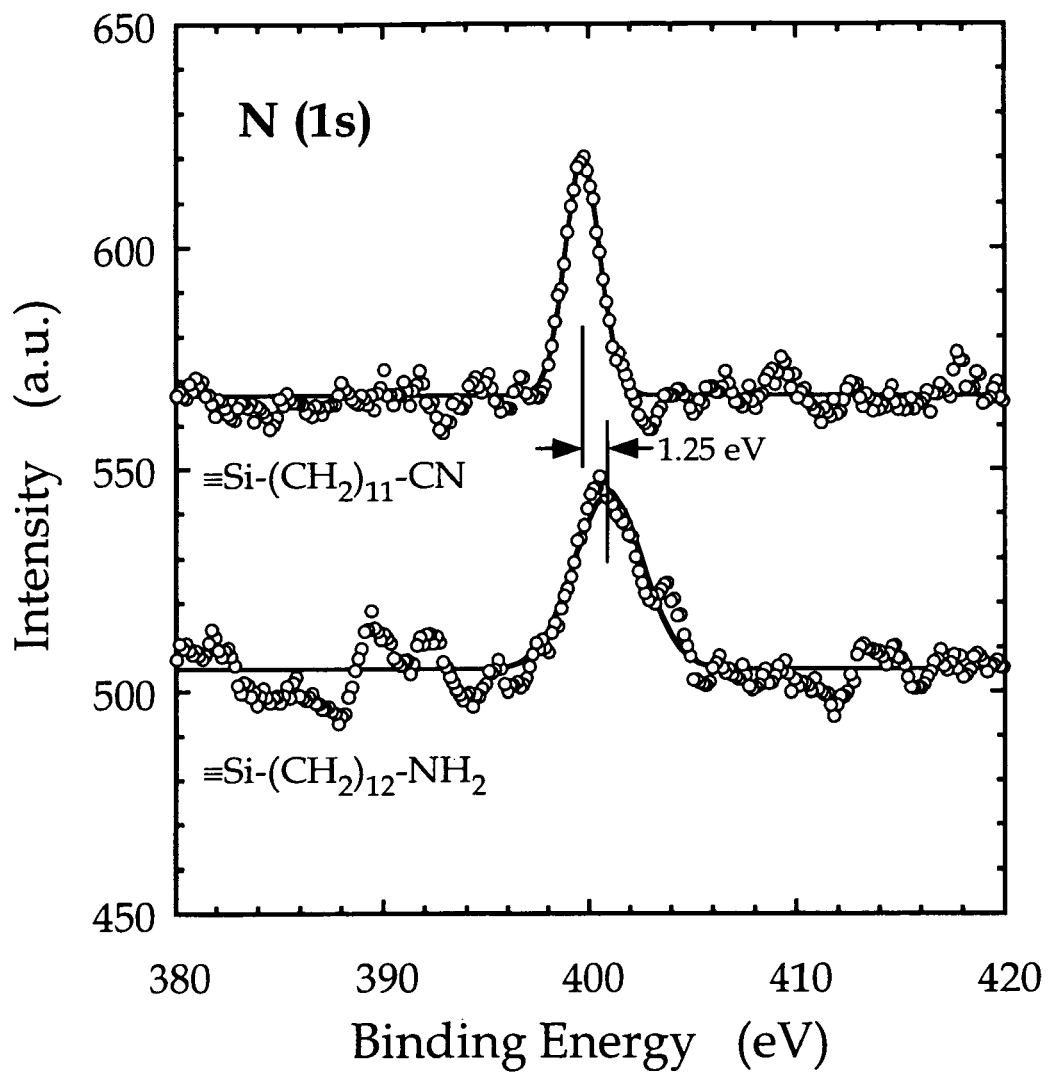
FIG. 3 is a diagram showing spectra for the N(1s) peak for both a —NH$_2$ terminated SAM and a —CN terminated SAM, according to principles of the invention.

FIG. 3 is a diagram showing spectra for the N(1s) peak for both a —NH$_2$ terminated SAM and a —CN terminated SAM, the latter not subjected to the chemical conversion described above in Sec. II.A. A fit of the data to a single Gaussian-Lorentzian product function is shown by the smooth curves. As may be seen, the N(1s) peak is shifted by 1.25 eV for the —NH$_2$ terminated SAM with respect to the —CN terminated SAM, which can be compared to a shift of 0.7-1.3 eV reported previously, confirming the effectiveness of the chemical conversion.

Figure 4:
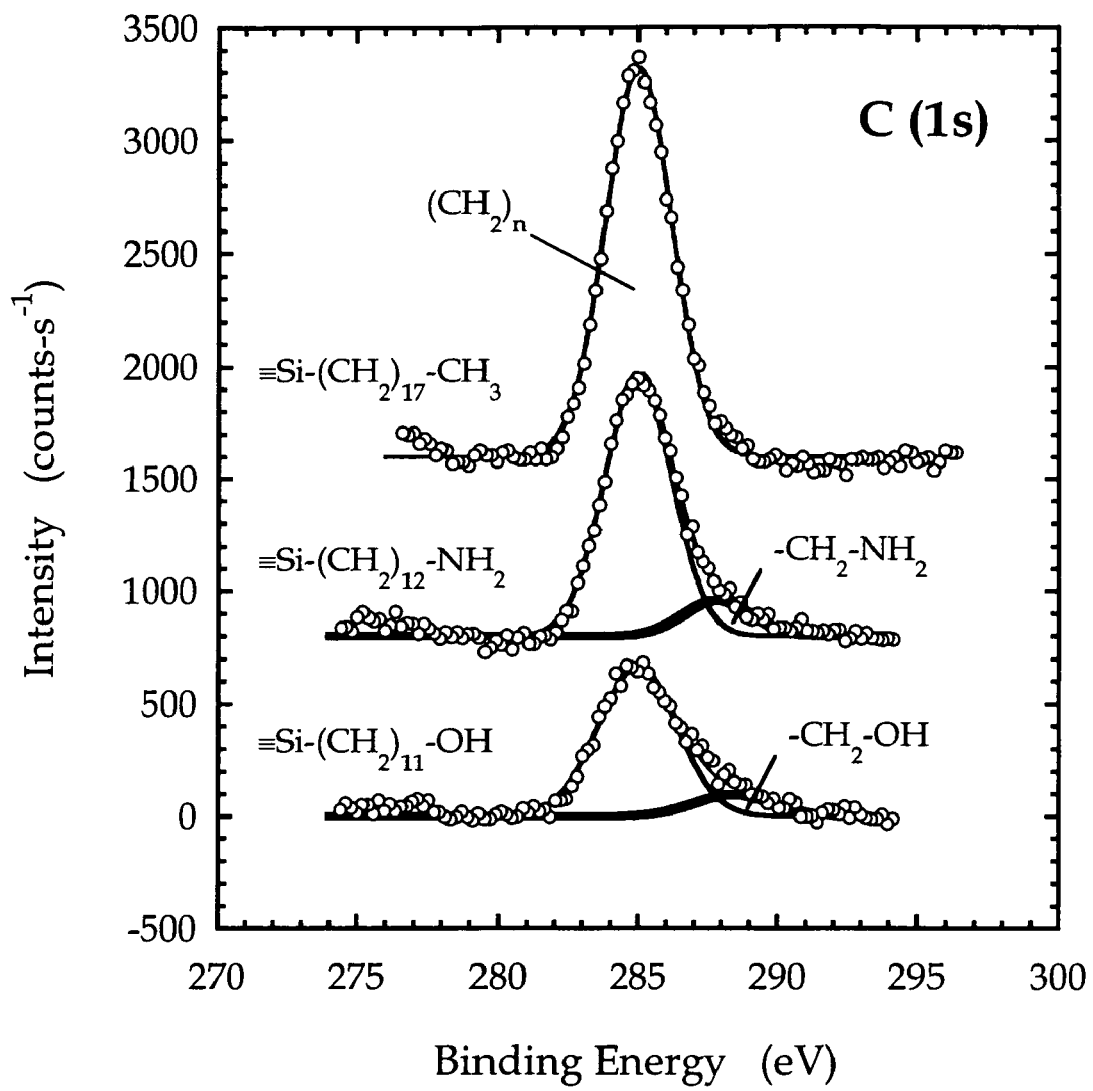
FIG. 4 is a diagram showing C(1s) spectra obtained from the —OH, —NH$_2$ and —CH$_3$ terminated SAMs, according to principles of the invention.

FIG. 4 is a diagram showing C(1s) spectra obtained from the —OH, —NH$_2$ and —CH$_3$ terminated SAMs. Spectra have been fit to single or multiple Gaussian-Lorentzian product functions, which are shown by the smooth curves. The spectra for the —CH$_3$ SAM is well fit to a single peak; whereas the —OH and —NH$_2$ SAMs are best fit with two peaks, one arising from the chemically shifted terminal carbon. These spectra are useful for two purposes: they provide additional evidence as to the effectiveness of the chemical conversion, and can be used to estimate the coverage of the SAMs. As may be seen, the peak for the 18-carbon chain SAM is the largest, which is expected if the 2-d packing densities are similar for the three SAMs. The spectra are best described by fits to one peak for the —CH$_3$ terminated SAM, and to two peaks for the —OH and —NH$_2$ terminated SAMs. The high energy shoulders are of course associated with the terminal —CH$_2$— groups bound to the —OH and —NH$_2$ endgroups. The fits give chemical shifts of 3.44 eV (cf. 1.6 eV) for the —OH SAM, and 2.84 eV for the —NH$_2$ SAM. In these fits, the ratios of the peak height of the chemically shifted component to that of the —CH$_2$— backbone were not free parameters but were fixed to be 0.146 for the —OH SAM, and 0.137 for the —NH$_2$ SAM (calculated using $\lambda_{SAM,C(1s)}$=24.5 Å).

As indicated above the C(1s) feature can be used to estimate the absolute coverage of the SAMs. To accomplish this one needs to account for the photoelectron cross-sections, $\sigma$, for the C(1s) and the Au(4f7/2) peaks, the analyzer transmission, T(E), which is inversely proportional to the kinetic energy for the spectra acquired in FIG. 4 (E=968.6 and 1169.6 eV, respectively), the atomic density of the two elements, N, and the inelastic mean free path, $\lambda$, for the photoelectrons. In principle, one also needs to account for the detector efficiency and the angular asymmetry of photoelectron emission, but these are not expected to vary significantly for the electron energies involved in this case. Concerning the factors that do play a role, $\sigma_{Au}/\sigma_C$=9.8, $N_{Au}$=5.88×10$^{22}$ atoms/cm$^3$, and $\lambda_{Au}$=15.5 Å. The atomic density of C in the SAM depends on the coverage or density of the SAM, $N_{SAM}$ (molecules/cm$^2$), and the mean spacing between C in the backbone, dC. The integrated intensity of the Au(4f$_{7/2}$) peak is proportional to $\sigma_{Au} N_{Au} \lambda_{Au} T(E_{Au})$. For the C(1s) peak, we must account for the finite thickness of the layer, and the integrated intensity is proportional to $\sigma_C(n_{SAM}/dC) \lambda_C T(EC) [1-\exp(-n\, dC/\lambda_C \cos \theta)]$, where n is the number of C in the SAM backbone and $\theta$ is the takeoff angle. For the inelastic mean free path of the C(1s) photoelectrons we use $\lambda_C$=24.5 Å. Making use of these expressions and the spectra shown in FIG. 4 we have computed the density of the SAMs, $n_{SAM}$, for the three cases considered here and these values are also given in Table 1. Given the assumptions made here to calculate these values, we estimate that their absolute accuracy is approximately ±30%, whereas the relative accuracy should be much better, i.e. ±10%. We see that the densities range from 2.96×10$^{14}$ molecules/cm$^2$ for the —OH SAM, to 4.38×10$^{14}$ molecules/cm$^2$ for the —NH$_2$ SAM, to 3.09-3.99×10$^{14}$ molecules/cm$^2$ for the —CH$_3$ SAM. These values can be compared to previous work where values of 4-5×10$^{14}$ molecules/cm$^2$ have been reported from x-ray scattering for ≡Si—(CH$_2$)$_{17}$—CH$_3$ and ≡Si—(CH$_2$)$_{11}$—CH$_3$ SAMs on native oxide, 3.7-4.2×10$^{14}$ molecules/cm$^2$ from UV-visible spectroscopy for ≡Si(CH)—(CH)—NH$_2$ on native oxide and 5.7×10$^{14}$ molecules/cm$^2$ for ≡Si—(CH$_2$)$_3$—NH$_2$ on Davisil silica.

B. Reaction of TDMAT with the SAMs: Adsorption Kinetics

The adsorption of TDMAT on chemical oxide and the three SAMs possessing different endgroups described above has been examined at three substrate temperatures, Ts=–50° C., 30° C. and 110° C. As described above, Ti(2p) spectra have been obtained after exposing the surface to TDMAT for a fixed period of time. This procedure has been repeated to obtain Ti(2p) spectra as a function of exposure time.

Figure 5:
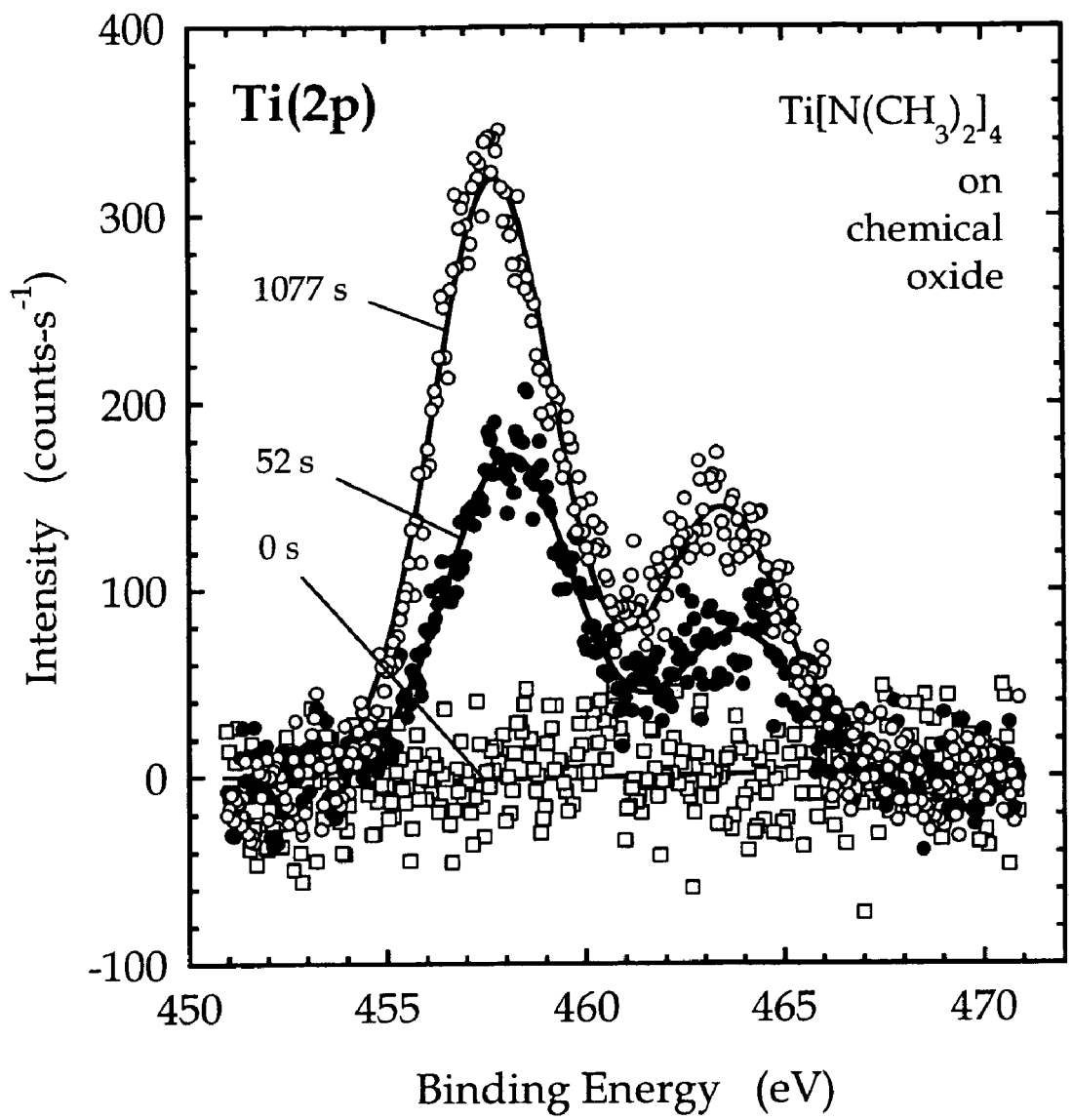
FIG. 5 is a graph showing Ti (2p) spectra for TDMAT adsorption on chemical oxide at Ts=30° C., according to principles of the invention.
Figure 6:
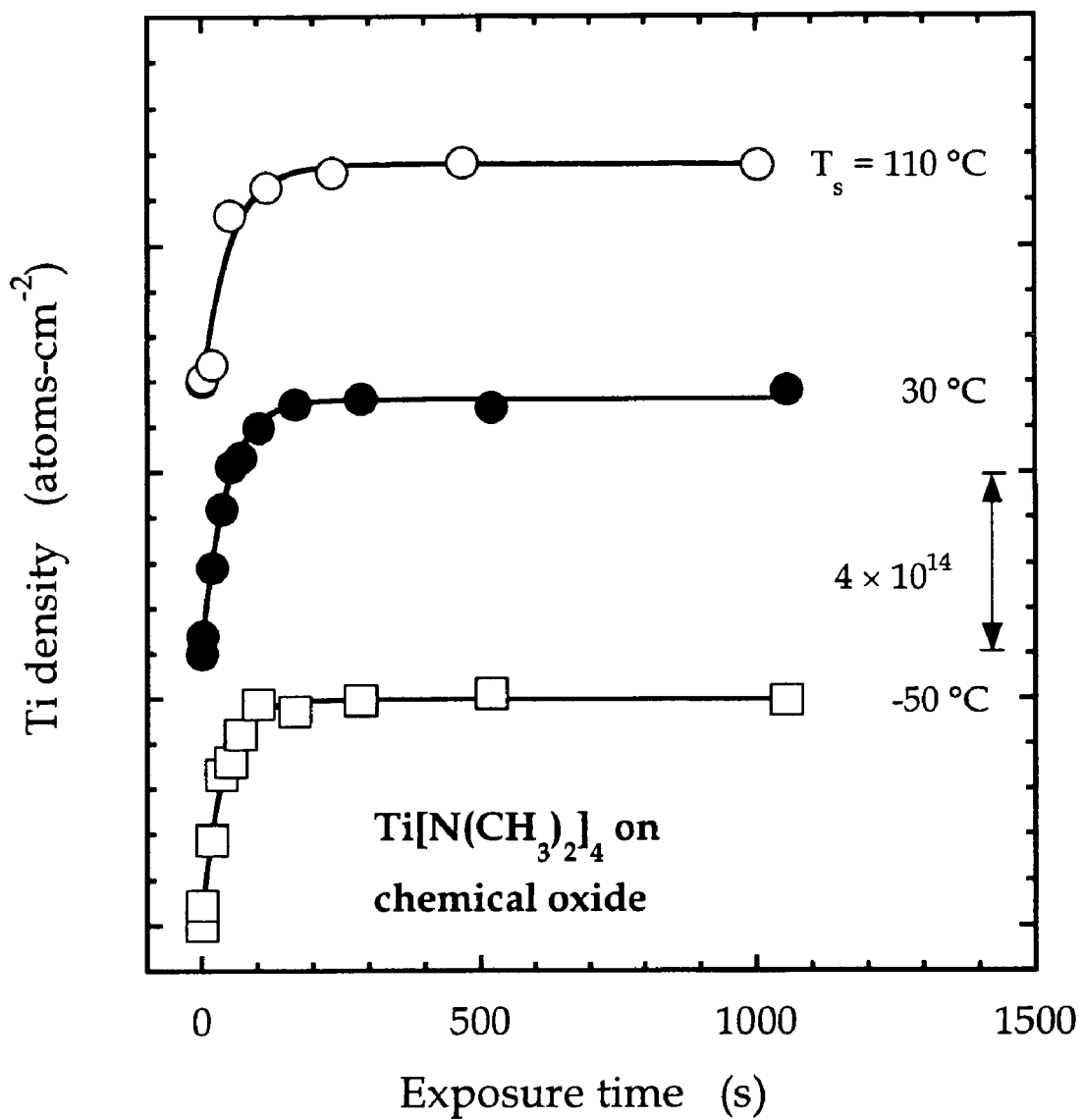
FIG. 6 is a graph showing are the coverage-exposure relationships for TDMAT adsorption on chemical oxide for the three temperatures examined: −50° C., 30° C. and 110° C., according to principles of the invention.
Figure 7:
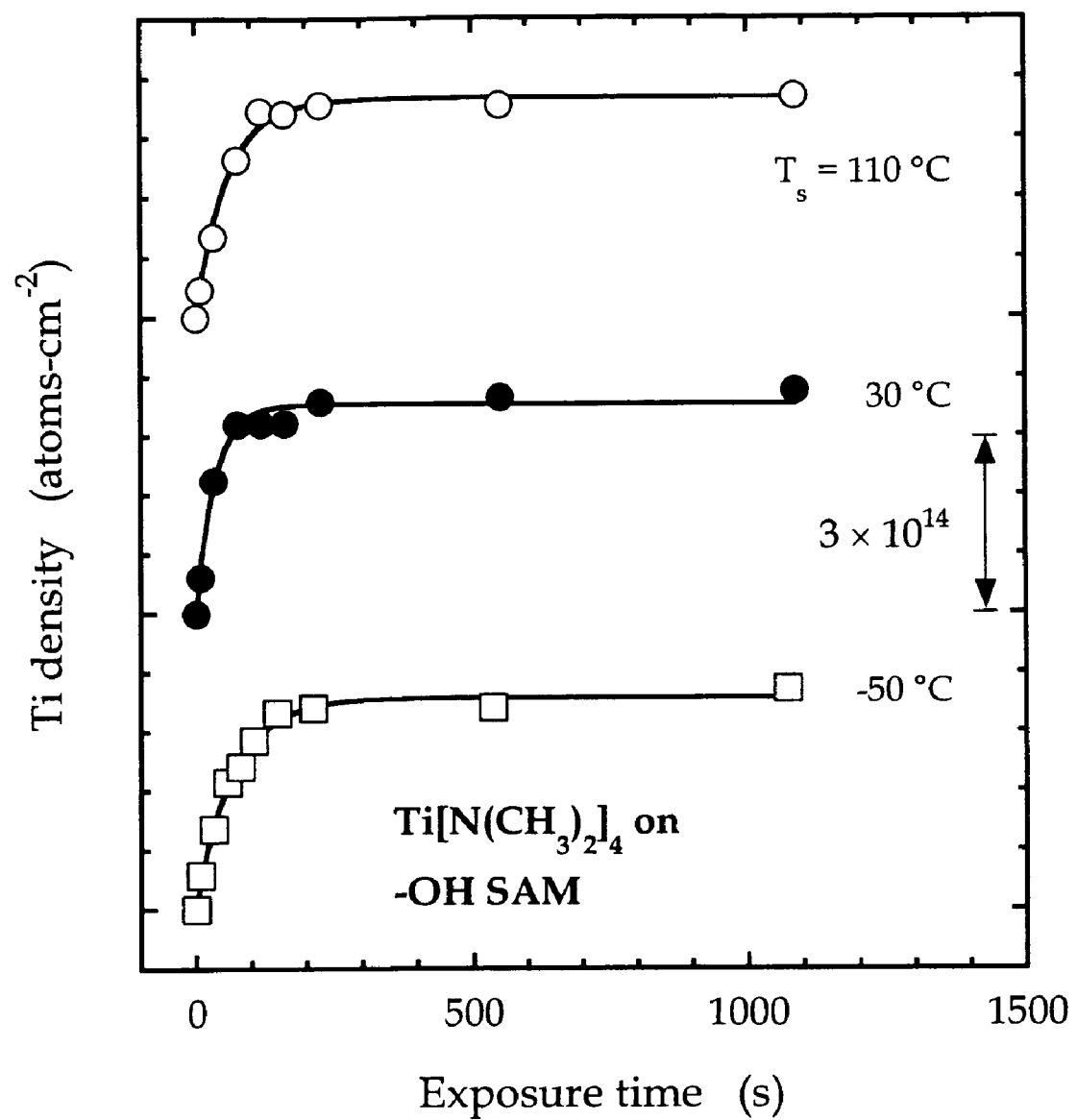
FIG. 7 is a graph showing are the coverage-exposure relationships for TDMAT adsorption on the —OH SAM for the three temperatures examined: −50° C., 30° C. and 110° C., according to principles of the invention.
Figure 8:
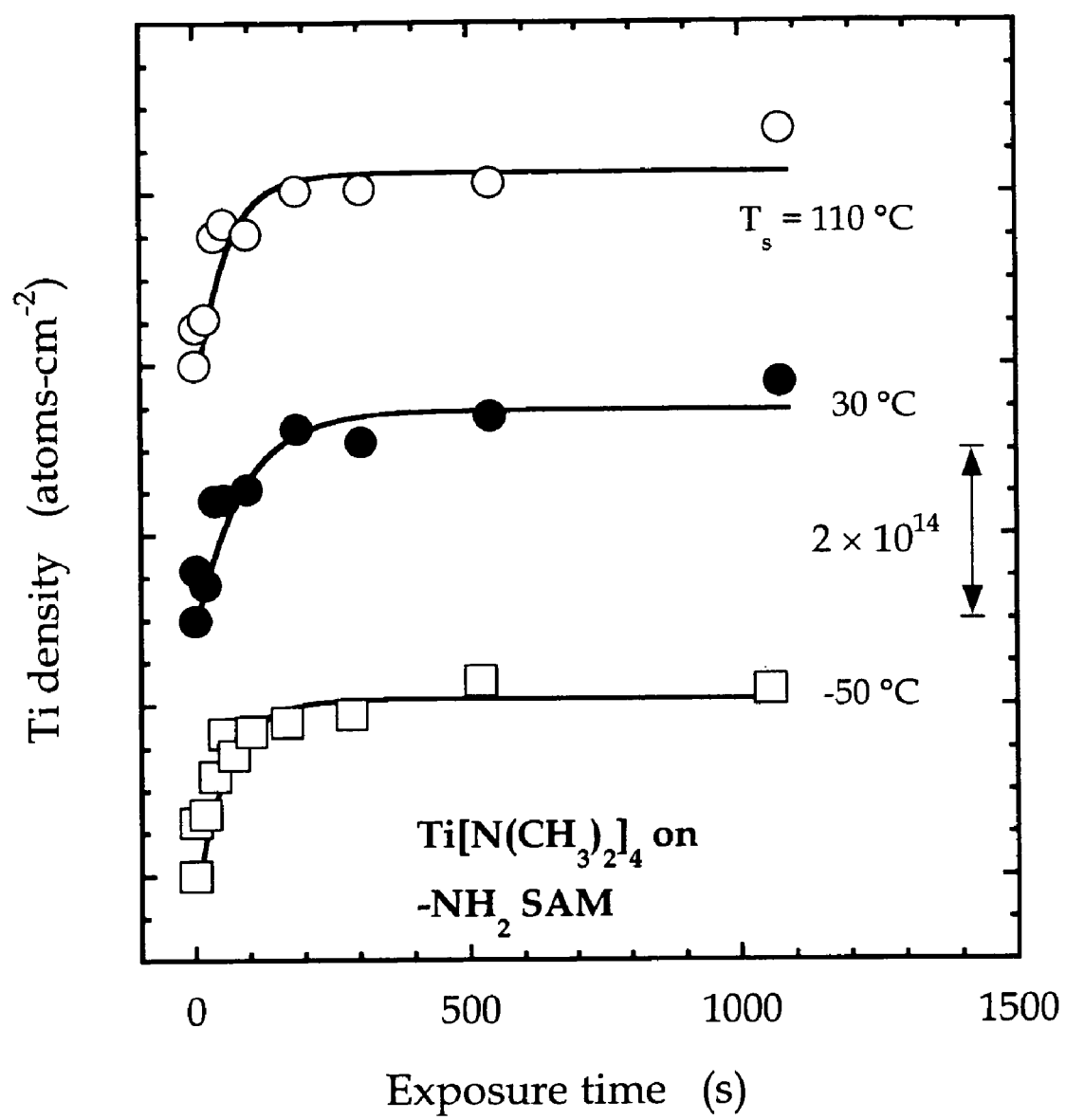
FIG. 8 is a graph showing are the coverage-exposure relationships for TDMAT adsorption on the —NH$_2$ SAM for the three temperatures examined: −50° C., 30° C. and 110° C., according to principles of the invention.
Figure 9:
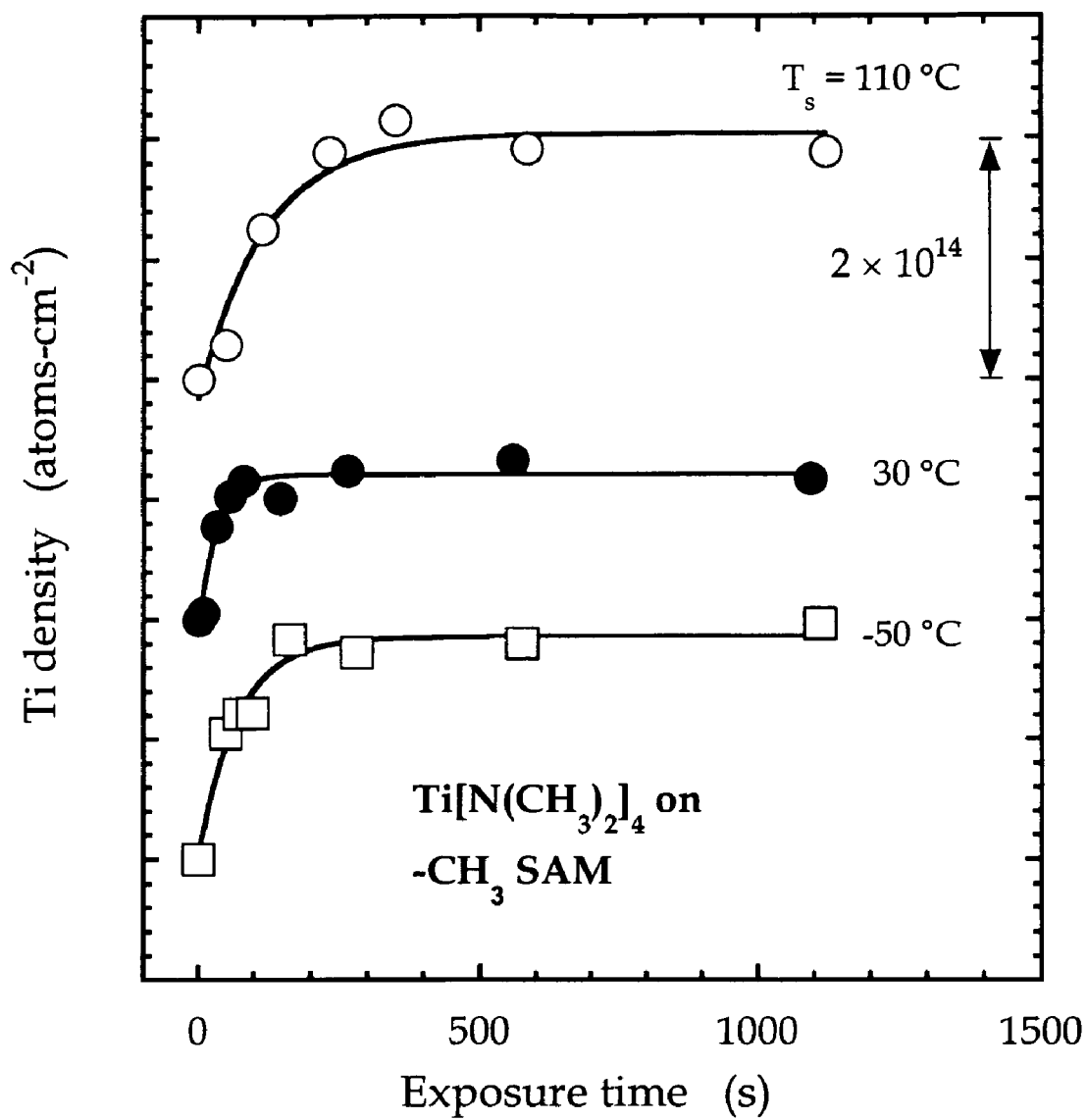
FIG. 9 is a graph showing are the coverage-exposure relationships for TDMAT adsorption on the —CH$_3$ SAM for the three temperatures examined: −50° C., 30° C. and 110° C., according to principles of the invention.

FIG. 5 is a graph showing Ti (2p) spectra for TDMAT adsorption on chemical oxide at Ts=30° C. Spectra have been fit to two peaks using Gaussian-Lorentzian product functions. Exposure times of the surface to TDMAT are as indicated. The smooth curves represent a fit of the spectra to a mixed Gaussian-Lorentzian function where a ratio of 0.45:1 is assumed for the area of the 2p$_{1/2}$ and 2p$_{3/2}$ peaks. As may be seen the peaks increase with increasing exposure. There also is a slight shift in the peak position with increasing exposure, the Ti(2p$_{3/2}$) peak shifts from 458.1 (52 s) to 457.7 eV (1077 s). This shift of 0.4 eV could represent relatively more Ti—O bonds present at lower coverages, e.g. Ti[N(CH$_3$)]$_2$(—O—Si)$_2$ vs. Ti[N(CH$_3$)]$_3$(—O—Si) species at high coverage, as described in more detail hereinbelow.

FIGS. 6-9 are graphs showing are the coverage-exposure relationships for TDMAT adsorption on chemical oxide, the —OH SAM, the —NH$_2$ SAM and the —CH$_3$ SAM, each for the three temperatures examined: –50° C., 30° C. and 110° C. In each case the data are offset along the ordinate to clearly display the quality of the fit to the data. The fits to the data, shown as smooth curves, are for a first-order Langmuirian model of adsorption. To quantify the Ti density on the surface, we collected spectra from bulk single crystalline TiO$_2$ (Commercial Crystal Laboratories Inc., Naples, Fla.) where the integrated intensity is proportional to $\sigma_{Ti} N_{Ti} \lambda_{Ti} T(E_{Ti})$ ($\lambda_{Ti}$=20.67 Å and $N_{Ti}$=3.2×10$^{22}$ atoms/cm$^3$). The titanium atoms in the TDMAT adlayer were modeled as a thin film of thickness dTi and titanium atomic density $N'_{Ti}$, whose integrated intensity is proportional to $\sigma_{Ti} N'_{Ti} d_{Ti} T(E_{Ti})/\cos \theta$, assuming $d_{Ti} \ll \lambda_{Ti}$. The quantity plotted in FIGS. 6-9 is $N'_{Ti} d_{Ti}$ (atoms/cm$^2$), and the greatest uncertainty in these absolute values is associated with the assumed value for $\lambda_{Ti}$ (probably at least ±30%). In all cases a number of models were fit to the data, including a first-order Langmuir model, and models assuming that an extrinsic mobile precursor exists for adsorption (e.g. the Kisliuk model). We found that the data was sufficiently well described by first-order Langmuirian kinetics, viz:

$$d\theta/dt = [S_{R,0} F/n_s](1-\theta) \quad [1]$$

where $\theta$ is the coverage of adsorbed TDMAT, $S_{R,0}$ is the initial probability of adsorption, F is the incident flux of TDMAT (molecules/cm$^2$s), and $n_s$ is the saturation coverage (molecules/cm$^2$).

Figure 10:
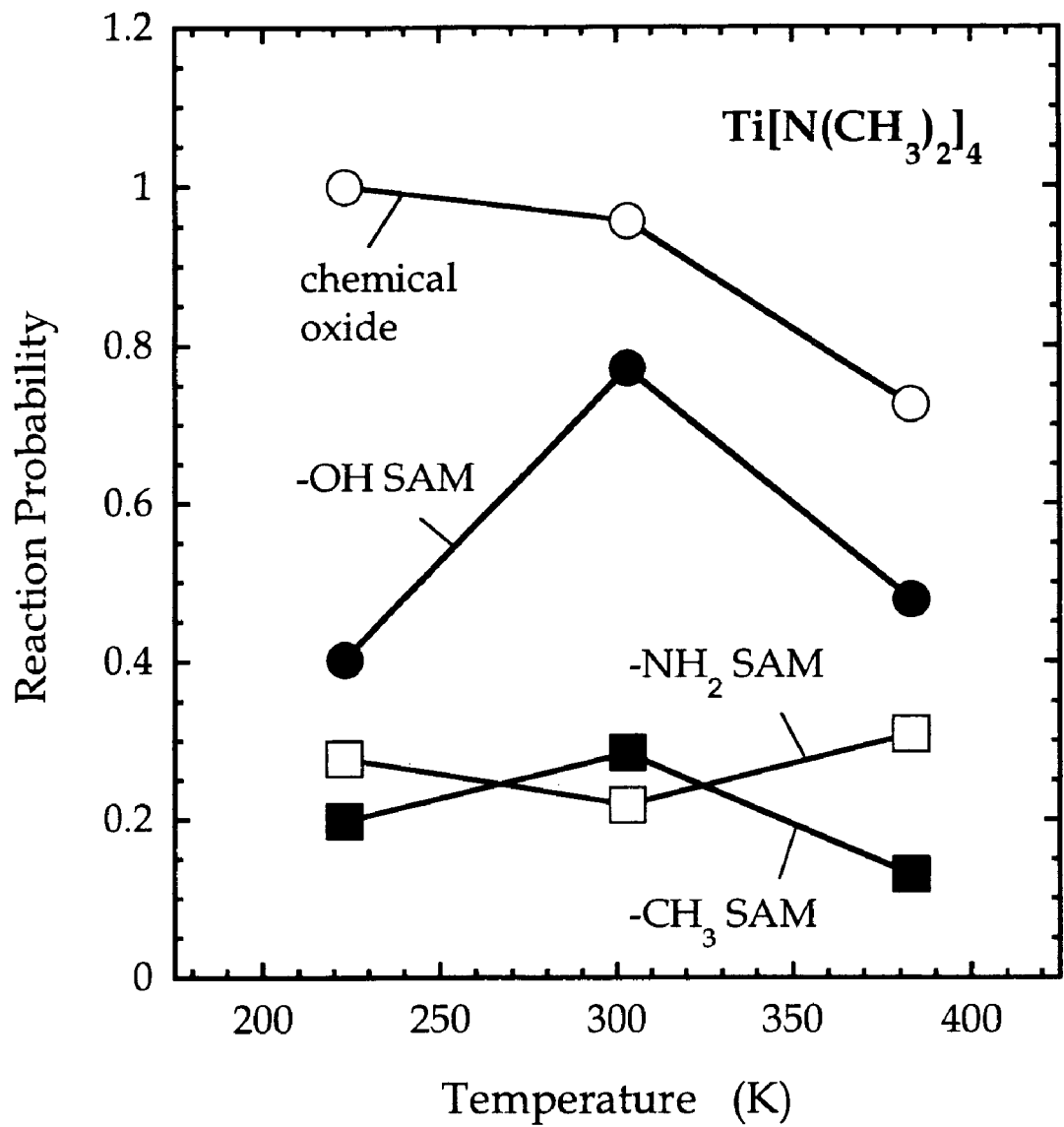
FIG. 10 is a graph of the initial reaction probability as a function of temperature for the four surfaces examined here, according to principles of the invention.

From the fits to the data displayed in FIGS. 6-9, coupled with an estimate of the incident flux of TDMAT as described above, we can evaluate both the initial reaction probability, $S_{R,0}$, and the saturation coverage, $n_s$. FIG. 10 is a graph of the initial reaction probability as a function of temperature for the four surfaces examined here, where the data have been normalized to the value for $S_{R,0}$ measured on chemical oxide at Ts=–50° C. As may be seen the initial reaction probability is highest on the chemical oxide, and $S_{R,0}$ decreases slightly with increasing substrate temperature. Making use of our estimate for the absolute flux of TDMAT, we estimate that $S_{R,0}$ ~0.48 on chemical oxide at Ts=–50° C., exhibiting an average value of ~0.43 for the reaction conditions examined here. Given the uncertainty in the values for estimates of the absolute flux and the absolute coverage, these absolute values for $S_{R,0}$ possess uncertainties of at least 50%. Next in reactivity is the —OH terminated SAM, which exhibits an apparent peak in reactivity with temperature, and an average value that is ~62% of that observed on chemical oxide. Reactivity of the —NH$_2$ and —CH$_3$ terminated SAMs are comparable (30% and 23% of that on chemical oxide), and no significant trend with substrate temperature is observed. For these reaction conditions, the observation of finite reactivity with the —CH$_3$ terminated SAM is unexpected, and these results demand further investigation. We shall return to this observation below.

Figure 11:
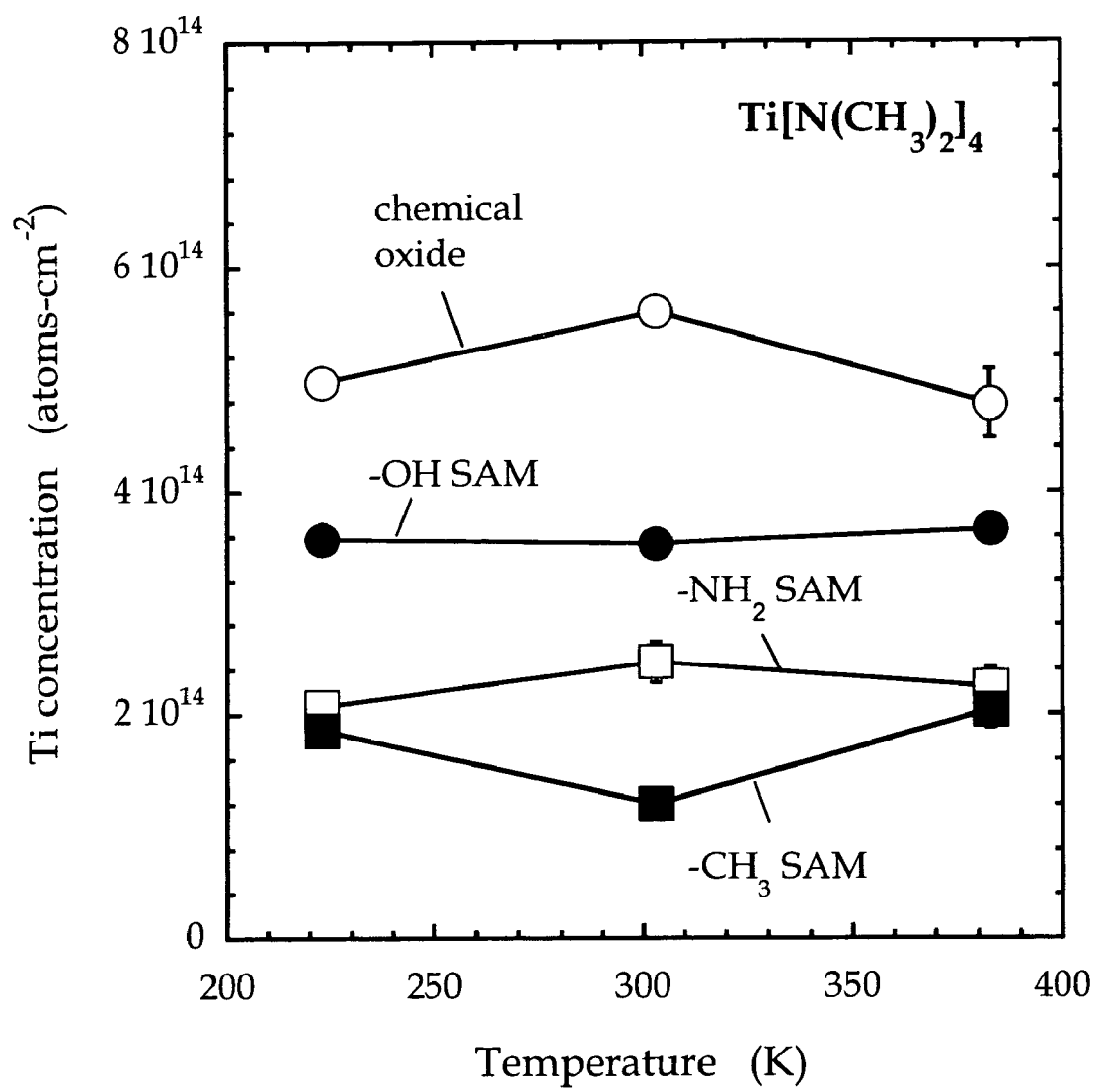
FIG. 11 is a graph showing the Ti saturation coverage for the four surfaces examined here as a function of substrate temperature, according to principles of the invention.

FIG. 11 is a graph showing the Ti saturation coverage for the four surfaces examined here as a function of substrate temperature. As may be seen, this quantity exhibits only a weak dependence on substrate temperature for all four surfaces examined. In comparing the surfaces, the ranking essentially follows that observed for the initial reaction probability. The average saturation density on the chemical oxide is ~5.12×10$^{14}$ atoms/cm$^2$, for the SAMs it is 3.59, 2.26 and 1.70×10$^{14}$ atoms/cm$^2$, for the —OH, —NH$_2$ and —CH$_3$ terminations, respectively. These values, certainly the latter, should be compared to the number density of functional groups present on the surface and we will return to this issue below. We also take note of the fact that these values assume that there is no attenuation of the Ti(2p) photoelectrons in the adlayer.

C. Reaction of TDMAT with the SAMs: Microstructure of the Adlayer

The results presented above, particularly those related to the chemisorption of TDMAT in FIGS. 5-11, demand a more in depth analysis of the chemisorbed layer. In particular, we have found that the starting surface to the formation of the SAMs, i.e. the chemical oxide, is the most reactive surface examined here. Thus, the possibility exists that the buried SAM/SiO$_2$ interface may retain substantial reactivity that must be accounted for in the analysis of these results. Angle resolved XPS is a very useful technique to probe the spatial extent of reaction of TDMAT with the self-assembled monolayers. By varying the take-off angle of emitted photoelectrons, those emitted by Ti atoms reacting at the SAM/SiO$_2$ interface are attenuated as compared to those from the Ti atoms reacting at the top of the SAM. Consequently, the Ti peak area may decrease with increasing take-off angle if all Ti atoms were at the SAM/SiO$_2$ interface, while the Ti peak area may actually increase with increasing take-off angle if Ti atoms react with the terminal group of the SAM owing to geometric effects (the area analyzed by the spectrometer increases as cos$^{-1}\theta$).

Figure 12:
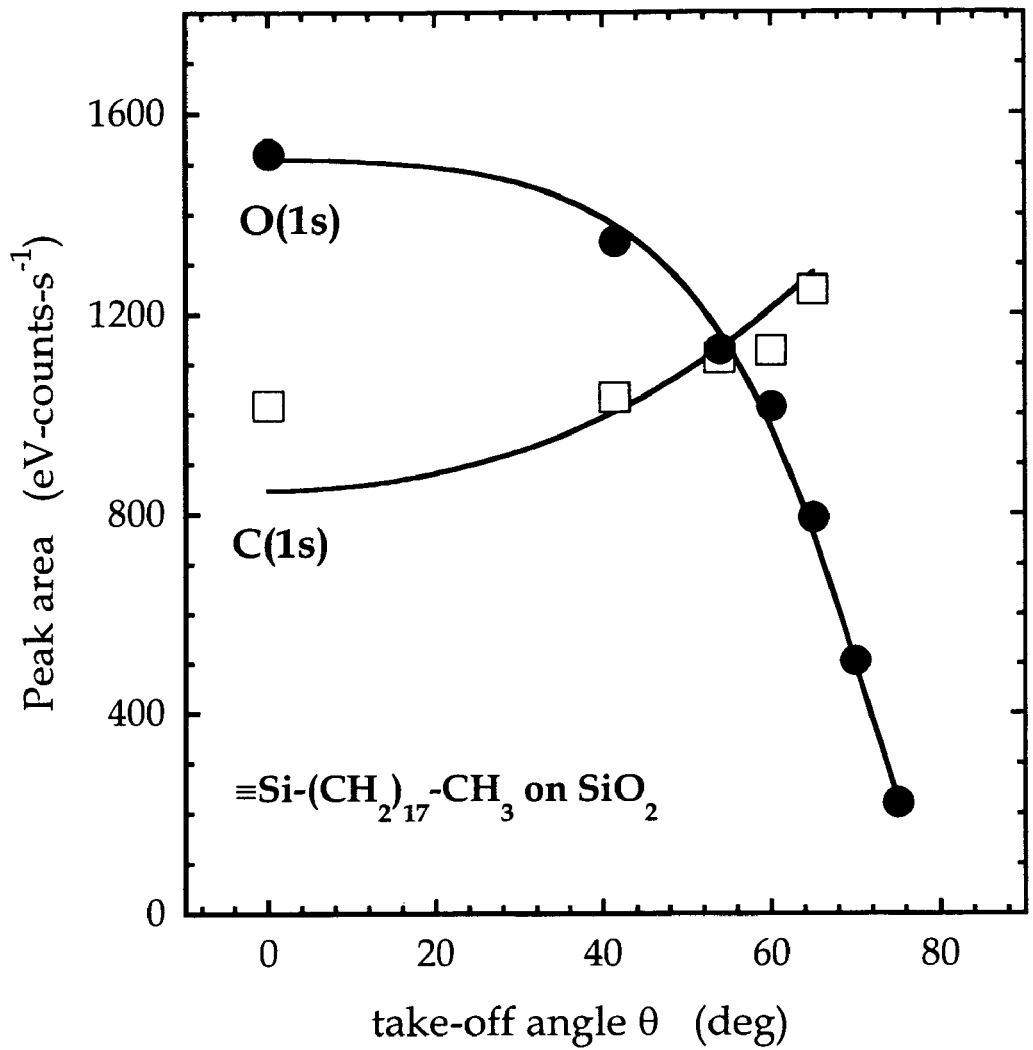
FIG. 12 is a diagram showing the integrated areas for the O(1s) and C(1s) peaks observed on an unreacted —CH$_3$-terminated SAM surface as a function of take-off angle, according to principles of the invention.

First we consider angle resolved x-ray photoelectron spectroscopy of the unreacted —CH$_3$ terminated SAM. FIG. 12 is a diagram showing the integrated areas for the O(1s) and C(1s) peaks observed on this surface as a function of take-off angle. We will analyze photoemission from this surface with a model that assumes that the underlying chemical oxide of thickness d$_{ox}$, is covered uniformly by the SAM, of thickness d$_{SAM}$. The corresponding inelastic mean free path of the photoelectrons in the two layers are given by $\lambda_{ox}$ and $\lambda_{SAM}$. For emission from the C in the SAM, the intensity is given by:

$$I_{C(1s)}(\theta) = I_{0,SAM,C(1s)}[1-\exp(-d_{SAM}/\lambda_{SAM,C(1s)}\cos\theta)] \quad [2]$$

whereas that for emission from the O in the chemical oxide is given by:

$$I_{O(1s)}(\theta) = I_{0,ox,O(1s)}\exp(-d_{SAM}/\lambda_{SAM,O(1s)}\cos\theta)[1-\exp(-d_{ox}/\lambda_{ox,O(1s)}\cos\theta)] \quad [3]$$

where I$_0$ represents the emission from a semi-infinite thin film of either the SAM [for C(1s)] or the chemical oxide [for O(1s)]. We have fit the data displayed in FIG. 12 simultaneously to the two above expressions minimizing the sum of the squares for both the O (1s) and C (1s) curves. In this fit up to 5 parameters could be included: the intensities corresponding to the semi-infinite thin films (I$_{0,i}$) and the three attenuation factors (d/$\lambda$)$_{SAM,C(1s)}$, (d/$\lambda$)$_{SAM,O(1s)}$, and (d/$\lambda$)$_{ox,O(1s)}$. To reduce the number of parameters to 3 we assumed $\lambda_{SAM,C(1s)}/\lambda_{SAM,O(1s)} = \{E[C(1s)]/E[O(1s)]\}^{1/2}$ and (d/$\lambda$)$_{ox,O(1s)}$=0.323 from an earlier analysis of the Si (2p) spectrum for chemical oxide. From a fit to the data, which is shown by the smooth curves in FIG. 12, we obtained (d/$\lambda$)$_{SAM,C(1s)}$=0.85 and (d/$\lambda$)$_{SAM,O(1s)}$=0.99. Making use of the ellipsometric thickness measured here, d$_{SAM}$=27 Å, we find that $\lambda_{SAM,C(1s)}$=31.8 Å, $\lambda_{SAM,O(1s)}$=27.4 Å and $\lambda_{SAM,Ti(2p)}$=28.8 Å based on $\lambda$ is proportional to E$^{1/2}$.

In order to quantify the spatial extent of reaction of TDMAT with the self-assembled monolayers, ARXPS was conducted on the four surfaces examined here, where in all cases the adsorbed layer was representative of that achieved at a saturation exposure at Ts=110° C. Take-off angles, from the surface normal, were varied from 0° to 65°. Take-off angles in excess of 65° resulted in extension of the area probed by the analyzer beyond the sample surface, making the sample platen visible.

Figure 13:
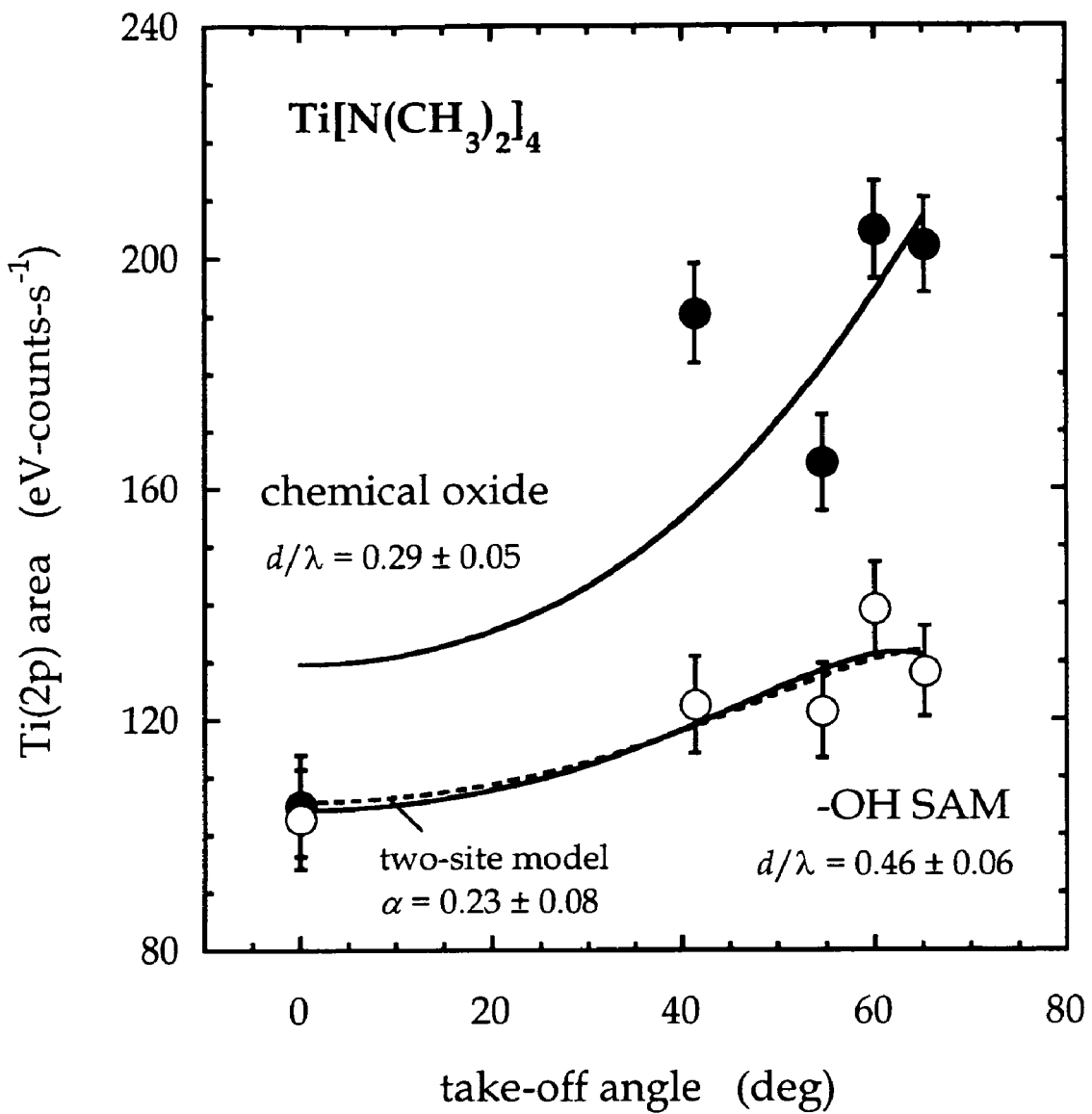
FIG. 13 is a graph showing the integrated Ti(2p) area for saturated adlayers of TDMAT on the chemical oxide and —OH terminated SAM as a function of take-off angle, according to principles of the invention.

FIG. 13 is a graph showing the integrated Ti(2p) area for saturated adlayers of TDMAT on the chemical oxide and —OH terminated SAM as a function of take-off angle. The smooth curves are a fit to the data to Eq. (4), which assumes that the Ti is uniformly distributed at a depth d from the surface, and the inelastic mean free path of the Ti(2p) photoelectrons is B. The values for the parameter d/$\lambda$ are shown in each case. Also shown as a dashed curve is a fit of the data for the —OH SAM to a two-site model, which involves a weighted sum of two terms equivalent to that given by Eq. (4). A similar set of results are shown in FIG. 14 for TDMAT on the —NH$_2$ and —CH$_3$ terminated SAMs.

Several qualitative observations can be made at this point. First, the Ti(2p) intensity for both the chemical oxide and the —NH$_2$ terminated SAM increases with increasing take-off angle, approximately by a factor of 2 as the angle increases from 0° to 65°. In contrast, for the —OH terminated SAM the increase is much more modest, while for the —CH$_3$ terminated SAM a decrease is observed. Even in the absence of a detailed fit to the data, which we consider next, these results indicate that there is something fundamentally different concerning the reaction of TDMAT on the —CH$_3$ terminated SAM, namely, that there is significant penetration of the molecule to the underlying SAM/SiO$_2$ interface.

Figure 14:
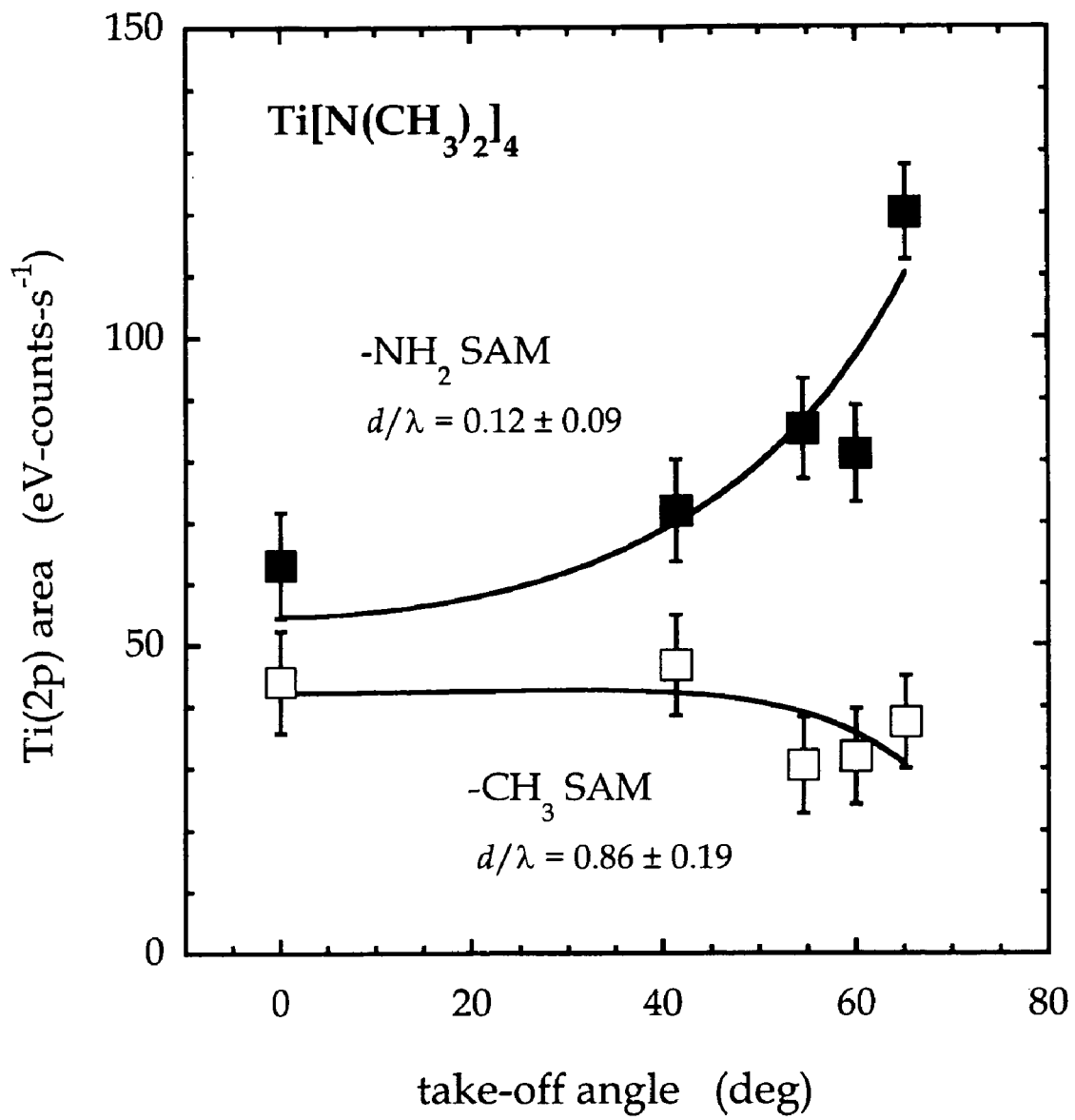
FIG. 14 is a graph showing the integrated Ti(2p) area for saturated adlayers of TDMAT on the —NH$_2$ and —CH$_3$ terminated SAMs, according to principles of the invention.

In order to analyze the results presented in FIGS. 13 and 14, we are required to make assumptions as to the distribution of TDMAT in the near surface region. In addition, we take note of the relatively limited data set, 5 take-off angles in each case. In comparison, in reference to FIG. 12, we used a three parameter model, coupled with independent information as to the thickness of the SAM and the SiO$_2$ layer to fit 7 data points. The fit to the data in this case, which was excellent, revealed parameters with small standard errors (a few %). Lacking a precise estimate for the Ti(2p) photoelectron inelastic mean free path (required to model data in FIGS. 13 and 14), we are led to make use of the simplest model that can still lead to significant conclusions. Thus, we will assume that the Ti in the adlayer is arranged in a 2-D plane at a distance d from the surface. This will actually be an excellent representation for the chemisorbed layer for the two limiting cases where: (i) reaction is solely with the terminal organic functional endgroup of the SAM, and (ii) reaction is solely at the SAM/SiO$_2$ interface.

Photoemission from such a layer is given by:

$$I(\theta) = (I_0/\cos\theta)\cdot\exp[-d/(\lambda\cos\theta)], \quad [4]$$

where I$_0$ represents the unattenuated emission one would achieve at a normal take-off angle. A fit to the data involves two parameters: I$_0$ and d/$\lambda$. These fits are given by the smooth curves shown in FIGS. 13 and 14, and the values obtained for the parameter d/$\lambda$ are also given in the figures. As may be seen the quality of the fit in each case is good, although due to the scatter in the data, the fits do not match the quality of the fit to the O(1s) spectra shown in FIG. 12. In terms of the parameter d/$\lambda$, we see that it increases in the order: —NH$_2$ SAM ~chemical oxide>—OH SAM>—CH$_3$ SAM. The value observed for the —NH$_2$ SAM, i.e. d/$\lambda$=0.12±0.09 is consistent with the reaction of TDMAT solely with the terminal —$NH_2$ group. The results for the chemical oxide, $d/\lambda=0.29\pm0.05$, are also consistent with TDMAT being located on the surface, and a finite value may reflect both the finite thickness of the adsorbed layer [the $N(CH_3)_2$ ligands may attenuate photoemission] and surface roughness. The results for the —OH SAM are intermediate in character, $d/\lambda=0.46\pm0.06$, and suggest that some penetration of the SAM may occur in this case. If we use the values for $\lambda_{SAM,Ti(2p)}$ deduced above from FIG. 12 without an uncertainty assigned, this suggests d ~13.3±1.7 Å, which is comparable to the thickness of the —OH SAM which is 17 Å. Finally, for the —$CH_3$ SAM, $d/\lambda=0.86\pm0.19$, or d ~24.8±5.5 Å, indicating significant penetration of this SAM (thickness ~27 Å) and reaction at the SAM/$SiO_2$ interface. As indicated above, this was the only surface that indicated a clear decrease in the Ti(2p) intensity at more glancing take-off angles.

We can extract additional details concerning the reaction of TDMAT with the SAMs by examining further the results from XPS, specifically the peak positions and areas associated with the key elemental components in TDMAT, and a comparison of the densities of the SAMs vs. that for Ti in the saturated adlayers.

Figure 15:
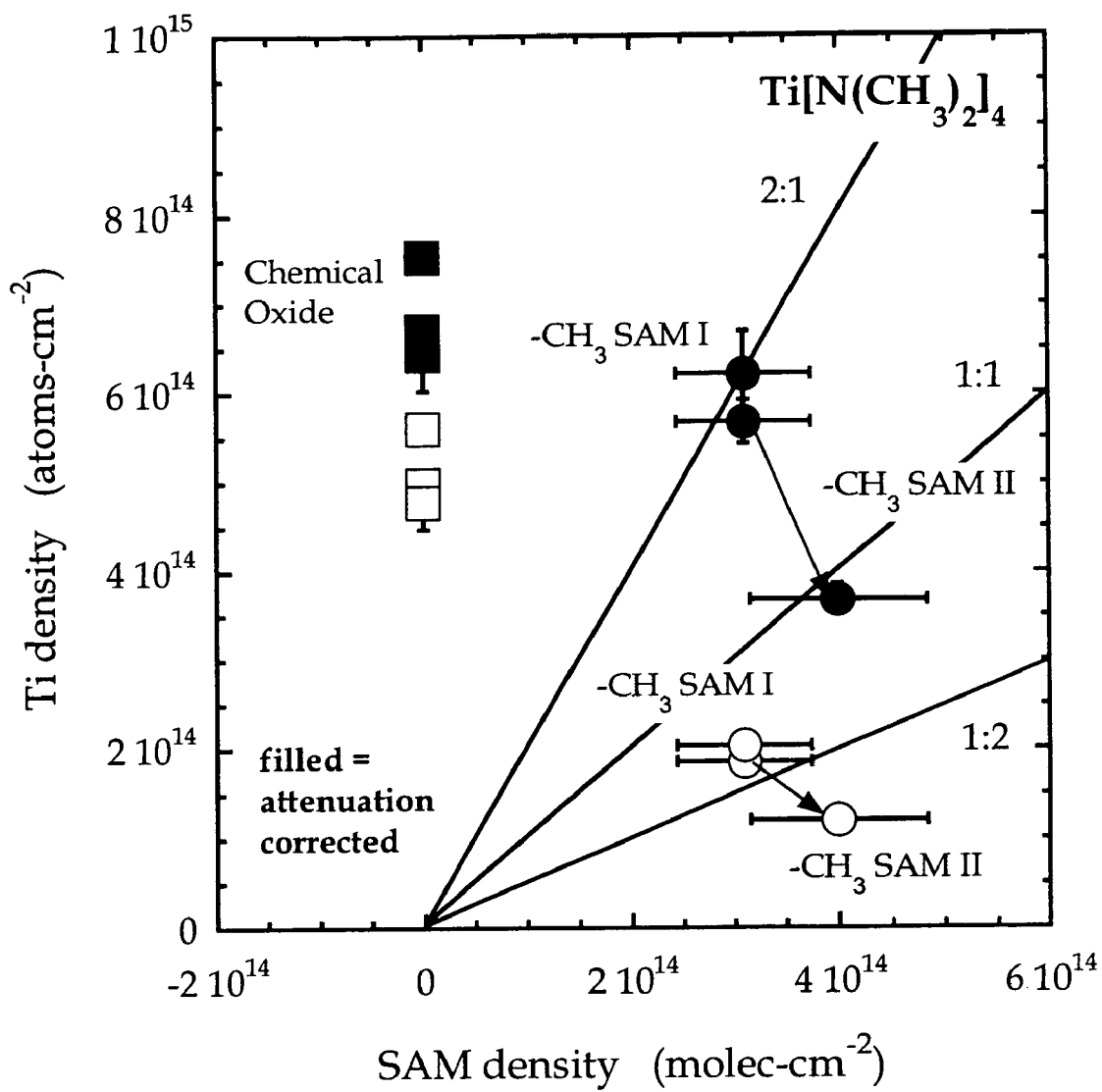
FIG. 15 is a diagram in which the saturation density of Ti vs. the SAM density on chemical oxide and of —CH$_3$-terminated layers are plotted, according to principles of the invention.
Figure 16:
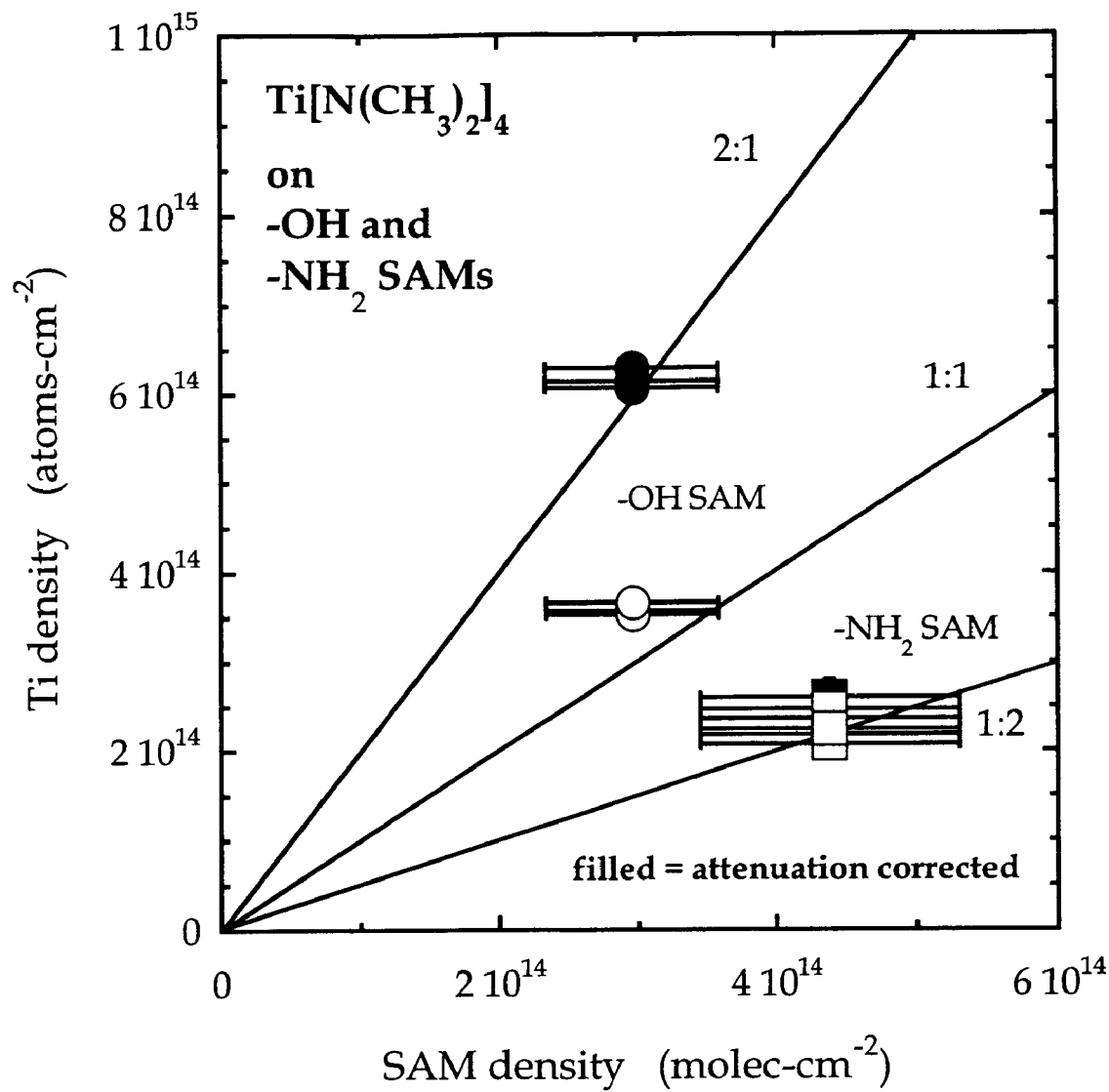
FIG. 16 is a diagram in which the saturation density of Ti vs. the SAM density of —OH and NH$_2$-terminated SAMs are plotted, according to principles of the invention.

FIGS. 15-16 are diagrams in which the saturation density of Ti vs. the SAM density, both deduced from XPS, are plotted. Open symbols are used to denote the estimates for the saturation densities of Ti plotted above in FIG. 11. In these figures, closed symbols are used to denote the saturation density predicted by application of Eq. (4) above, which accounts for attenuation by the self-assembled monolayers. The latter is justified in the context of the ARXPS results discussed above penetration of the SAM was indicated clearly for the —$CH_3$ SAM, possibly for the —OH SAM, and for adlayers such as these the actual saturation density of Ti will be underestimated if Eq. (4) is not employed. In FIG. 15, two cases are shown: $Ti[N(CH_3)_2]_4$ adsorbed on chemical oxide and on a —$CH_3$ terminated SAM. In FIG. 16, two cases are shown: $Ti[N(CH_3)_2]_4$ adsorbed on —OH and —$NH_2$ terminated SAMs. The open symbols represent the case where we have assumed that the photoemission from the Ti in the adlayer in unattenuated; the filled symbols assume that the Ti is uniformly distributed at a depth d from the surface, and the amount of attenuation has been accounted for by using the results from ARXPS (FIG. 14). SAM I and SAM II refer to different batches of the —$CH_3$ terminated SAM.

We begin the discussion with the SAM expected to be totally unreactive with TDMAT, namely the —$CH_3$ terminated SAM. In the course of conducting these experiments we made use of one batch of —$CH_3$ SAM (marked II here) whose density was higher by ~25% than other SAMs examined here. Although not intentional on our part, this affords the opportunity to examine the effect of SAM density on TDMAT adsorption in this case. As may be seen, there is a negative correlation between the density of Ti adsorbed, and that of the —$CH_3$ SAM. This is entirely as expected in this case, as the ability of TDMAT to penetrate the SAM to find the reactive SAM/$SiO_2$ interface should increase with decreasing SAM density. Thus, combined with the observations from ARXPS, these results further validate the picture of TDMAT adsorption on the —$CH_3$ SAM there is no reaction with the terminal groups; it is confined completely to the SAM/$SiO_2$ interface. If we assume that this negative correlation between the SAM density and the Ti density is linear, a fit to both sets of estimates for the Ti density predicts that a density of ~$5.3\times10^{14}$ per $cm^2$ may be sufficient to prevent penetration of TDMAT, and reaction at the SAM/$SiO_2$ interface. Using other assumptions, for example, where we only include the attenuation corrected data (but also the results on chemical oxide), lead to models where the Ti density varies in a nonlinear fashion with SAM coverage, viz., $1-(n_{SAM}/n_{SAM,sat})^m$. A fit to this latter function gives $n_{SAM,sat}$~$4.7\pm0.4\times10^{14}$ per $cm^2$, and m~4.8±1.9. In either case, our results for the —$CH_3$ SAM are entirely consistent with TDMAT reaction at the SAM/$SiO_2$ interface, which might be blocked completely by a sufficiently dense SAM.

We next move to a discussion of the results for the terminal groups anticipated to be reactive. First, for the —OH SAM we see that the ratio between the density of adsorbed Ti molecules and the —OH groups present on the SAM depends upon the Ti estimate used: it is ~1:1 using the model that assumes Ti is present at the surface; whereas it is ~2:1 using the model that assumes all of the Ti is below the surface (~13 Å, based on the fit in FIG. 13). Given this intermediate result for the —OH SAM we have made use of a more complicated, two-site model to fit the ARXPS data shown in FIG. 13. Briefly, this model makes use of a weighted sum of two terms given by Eq. (4) where the Ti atoms are either present in an adlayer at the surface (at depth $d_{ad}$), or are buried at the SAM/$SiO_2$ interface (at depth $d_{SAM}$). We further assume the inelastic mean free path for the photoelectrons are identical for both layers, and we use the $\lambda$'s derived from FIG. 12 to make an estimate for $\lambda_{SAM,Ti(2p)}$. We are left with basically two parameters: $I_0$ and the quantity $\alpha$, which we define as the fraction of Ti that is bound at the surface. Our fit to the data using this model is shown in FIG. 13. The value for the parameter $\alpha$ that we find in this case is: $\alpha=0.23\pm0.08$. This is consistent with TDMAT reacting at both the terminal —OH group and at the SAM/$SiO_2$ interface for the —OH SAM examined here.

For the —$NH_2$ SAM, our results are very clear. Namely, the results from ARXPS indicate that little or no penetration has occurred, and reaction is confined to the terminal group at the surface. It should be noted that based on our results from XPS, the —$NH_2$ SAM possessed the highest density of any SAM we examined here. It is likely that this is the best explanation for why penetration of this SAM was not observed. Given the certainty of the location of the reaction, we are afforded the opportunity to consider the stoichiometry of the reaction in this case. As may be seen from FIG. 16, our results are most consistent with a stoichiometry of Ti:SAM of between 1:2 and 2:3. The interpretation of the results can be made directly: either ~½-⅔ of the —$NH_2$ have reacted with TDMAT (e.g. $(R_2N)_3$Ti—NH—$CH_2$—..., with ½ remaining unreacted), or on average ~1.5-2 —$NH_2$ groups have reacted with each TDMAT [e.g. $(R_2N)_2$Ti—(NH—$CH_2$—...)$_2$]. At this point, either of the possibilities is plausible. The highest density of Ti observed on the —$NH_2$ SAM is $2.47\pm0.19\times10^{14}$ atoms/$cm^2$. If this density represents a hexagonally close-packed array of spheres, they would have a diameter of 6.8±0.3 Å. This size is not unreasonable for a $Ti[N(CH_3)_2]_3$(a) species from the density of liquid TDMAT we estimate a diameter of 8 Å.

A final set of results concerns an examination of the Ti(2p) and N(1s) peaks after exposure of the SAMs to TDMAT. First we shall consider the ratio of the areas of these two peaks, which after suitable corrections for photoelectron cross-sections, analyzer transmission, inelastic mean free path of the respective photoelectrons and atomic density give insight into the stoichiometry of the adsorbed layer.

Figure 17:
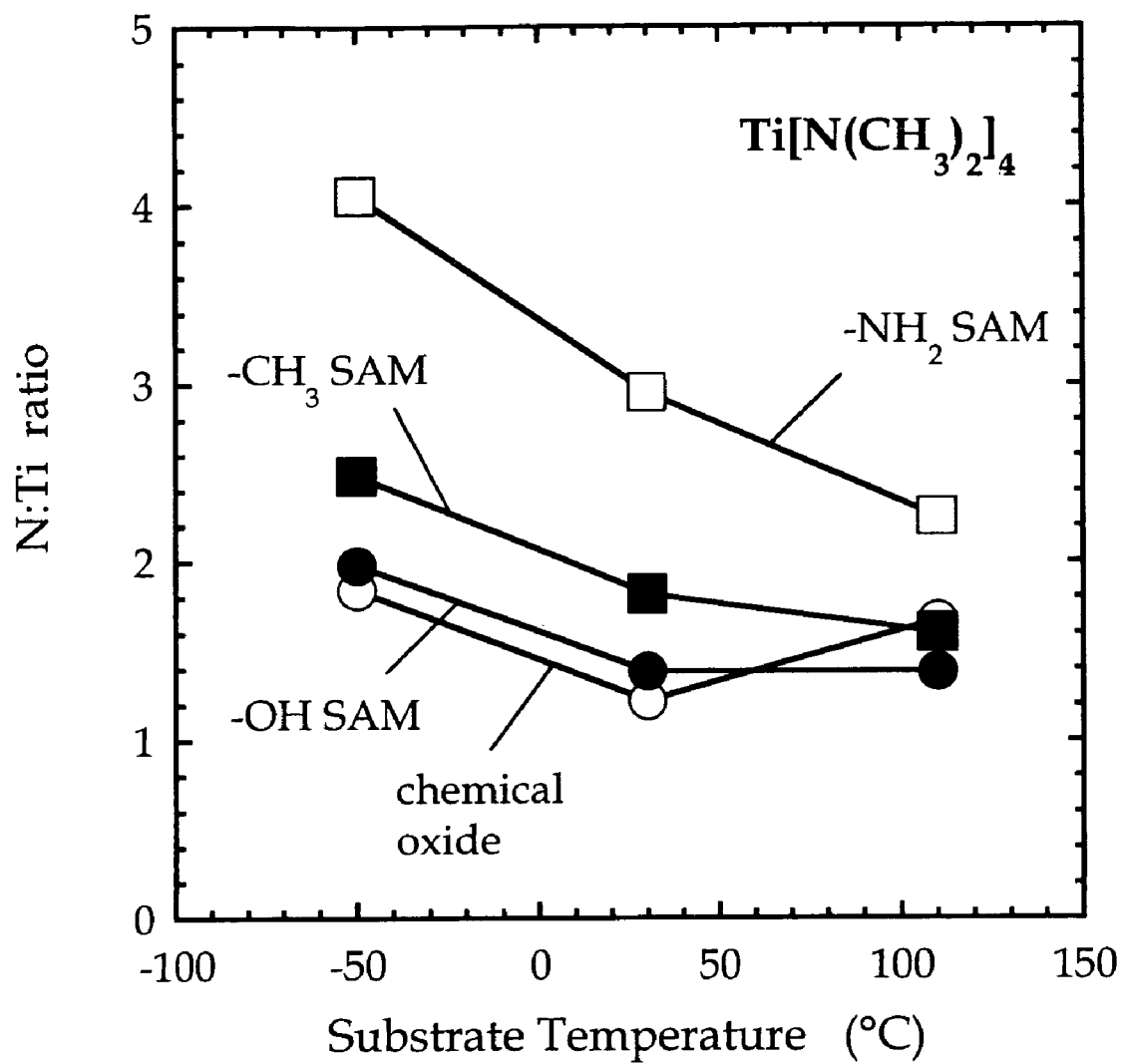
FIG. 17 is a graph showing the N:Ti atomic ratio in the adlayer as a function of the substrate temperature during exposure to TDMAT, according to principles of the invention.

FIG. 17 is a graph showing the N:Ti atomic ratio in the adlayer as a function of the substrate temperature during exposure to TDMAT, for $Ti[N(CH_3)_2]_4$ adsorbed on chemical oxide and the —OH, —$NH_2$ and —$CH_3$ terminated SAMs. For unreacted TDMAT, this ratio will be 4:1. Two things are apparent from the figure. First, significant decomposition (i.e. loss of the N(CH$_3$)$_2$ ligands) is implied by the results for TDMAT reacting on chemical oxide, and the —OH and —NH$_2$ terminated SAMs; and, second, for all surfaces examined this decomposition becomes more significant at higher temperatures. Chemisorption presumably involves, at minimum, loss of one N(CH$_3$)$_2$ ligand, thus, we expect this ratio to be either 3 or 4, depending upon the identity of the linking group (—O— or —NH—). The results for the chemical oxide, —OH and —CH$_3$ SAM seem to suggest that Ti is bound to these surfaces by 2-3 linkages, where only 1-2 N(CH$_3$)$_2$ ligands are retained by the parent molecule.

For the —NH$_2$ SAM, based on this data alone the situation is somewhat ambiguous, as —NH— is presumably the linking group. A ratio of 4 could in principle be consistent with a number of scenarios. If we consider the data also shown in FIG. 16, however, some of these can safely be excluded. If we take the Ti:SAM ratio to be 1:2, then an adlayer consisting of entirely (R$_2$N)$_2$Ti—(NH—CH$_2$— . . . )$_2$ species would give a N:Ti ratio of 4. In comparison, formation of a (R$_2$N)$_3$Ti—(NH—CH$_2$— . . . )$_2$ species on every other —NH$_2$ SAM would give a ratio of 5. In either event, the results for the —NH$_2$ SAM also indicate considerable loss of ligand at 110° C., where as few as one ligand may remain attached to the parent molecule (the "baseline" ratio should be 2 given assumed 1:2 Ti:SAM ratio).

Examination of the chemical shift of the Ti(2p) feature can also give clues as to the nature of the species formed on the surface. Binding energy of titanium in physisorbed TDMAT has been reported to be 457.5 eV, whereas that for elemental Ti and Ti bound in TiN and TiO$_2$ are reported to be 453.89, 455.8 and 458.7 eV, respectively. We have fit the Ti(2p) feature to two peaks using Gaussian-Lorentzian product functions, identical to the procedure used above in FIG. 5. In all cases, peaks were referenced to the C(1s) peak, in an attempt to account for effects due to the build-up of static surface charge. Briefly we find that for adsorption at −50° C., on all surfaces, and at coverages representative of saturation, the Ti(2p$_{3/2}$) binding energy is close to that reported for physisorbed TDMAT. For higher temperatures of adsorption (Ts=30 and 110° C.) we find that the Ti(2p) binding energy lay between 457.5 and 458.7 eV, which is consistent with the adsorbed TDMAT being bound to either N or O species, while retaining some N(CH$_3$)$_2$ ligands. A slight trend toward higher binding energy at higher Ts was also observed.

Figure 18:
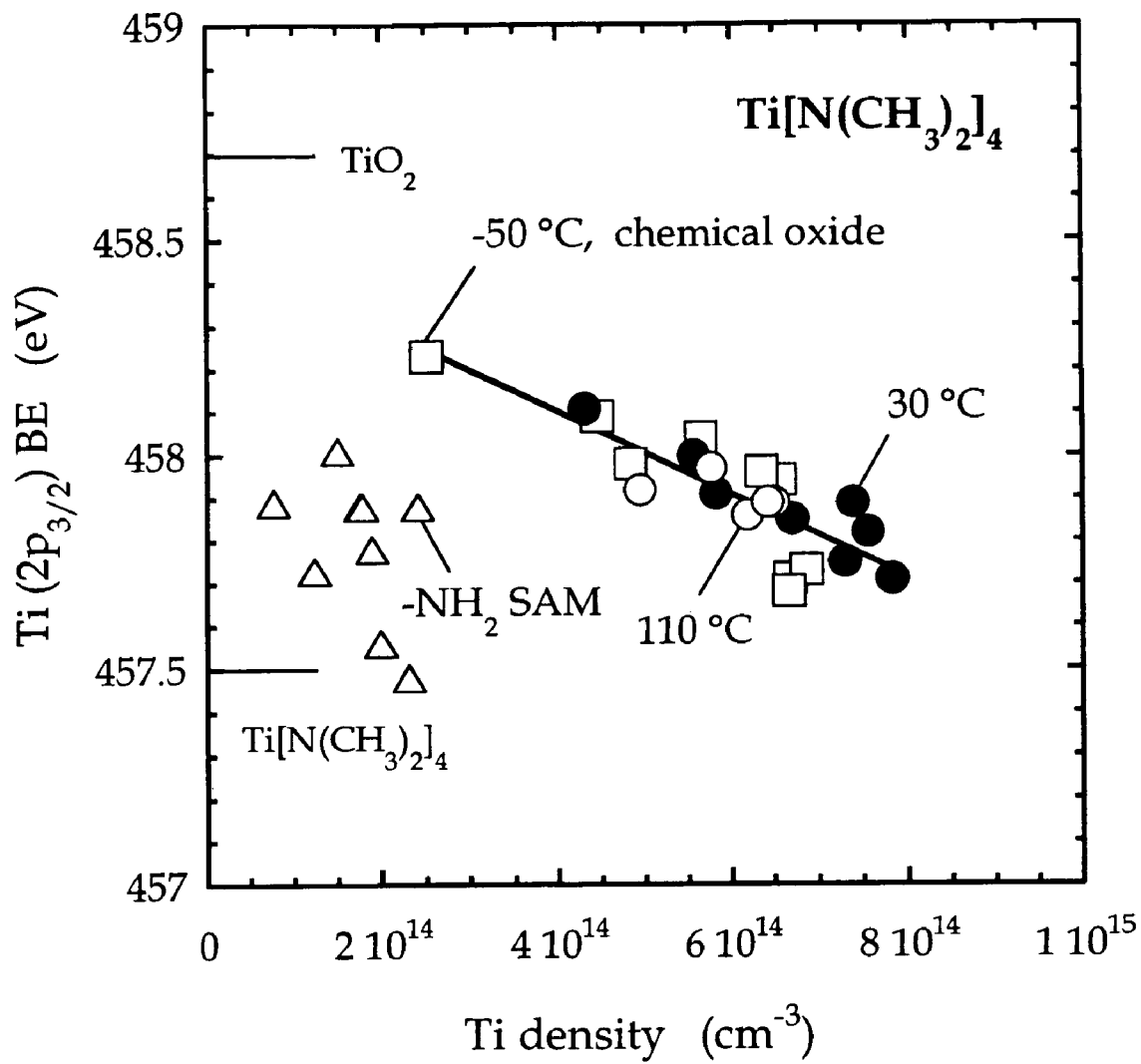
FIG. 18 is a diagram showing a plot the Ti(2p) binding energy vs. Ti density for adsorption on the chemical oxide (squares=−50° C., filled circles=30° C., open circles=110° C.) and the —$NH_2$ SAM (−50° C. only) (triangles), according to principles of the invention.

FIG. 18 is a diagram showing a plot the Ti(2p) binding energy vs. Ti density for adsorption on the chemical oxide (squares=−50° C., filled circles=30° C., open circles=110° C.) and the —NH$_2$ SAM (−50° C. only) (triangles), taking into account the effect of coverage. For the chemical oxide we see essentially a linear decrease in the binding energy with increasing coverage. A similar trend is observed on the —NH$_2$ SAM, although the scatter in the data makes this observation less conclusive. On the chemical oxide, a decrease in the binding energy would be consistent with more Ti—O bonds at low coverage, and more loss of N(CH$_3$)$_2$ ligands, whereas more bonding to N [bridging Ti—N—Ti or as N(CH$_3$)$_2$] at higher coverages.

Figure 19:
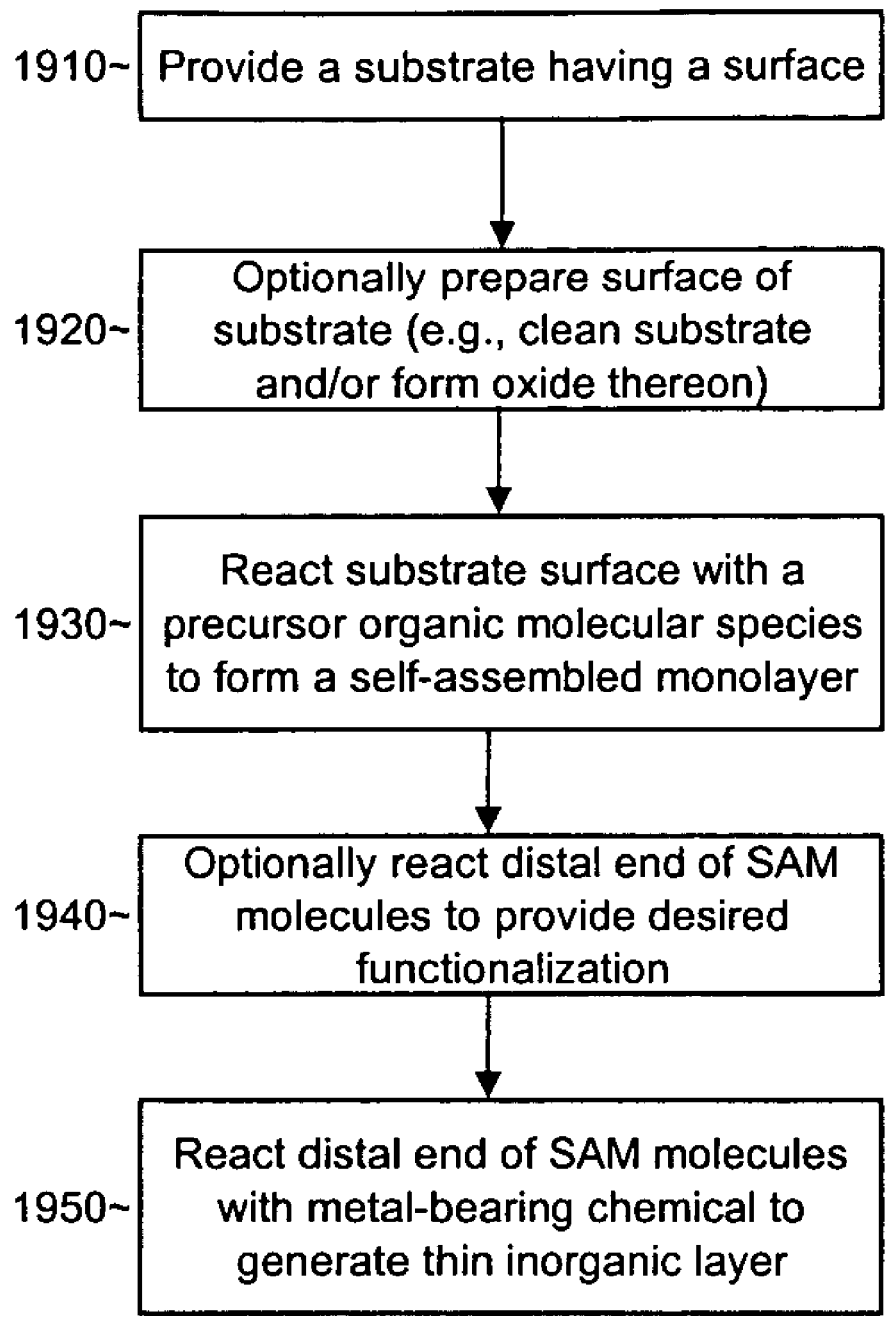
FIG. 19 is a flow chart showing steps in the process of fabricating inorganic thin films using a self-assembled monolayer on a substrate of interest, according to principles of the invention.

FIG. 19 is a flow chart showing steps in the process of fabricating inorganic thin films using a self-assembled monolayer on a substrate of interest, according to principles of the invention. At step 1910, a substrate having a surface is provided. In some embodiments, the substrate is a silicon wafer. At step 1920, the surface of the substrate is optionally prepared, if it is not already in suitable condition. For example, the silicon wafer can be cleaned, and/or oxide can be formed thereon, as explained hereinbefore. At step 1930, the surface of the substrate is reacted with one end of a molecule that forms a self-assembled monolayer. As explained hereinbefore, alkyltrichlorosilanes having the general formula R1-R—SiCl$_3$, where R1 is —OH, —NH$_2$, —COOH, —SH, COOCH$_3$, —CH=CH$_2$, —CN, and R is a conjugated hydrocarbon, such as (CH2)$_n$, where n is in the range of 3 to 18 are examples of such molecular species. At step 1940, the distal end of the molecules comprising the SAM can optionally be modified to have a particular functionality, as explained hereinbefore. At step 1950, the distal ends of the molecules comprising the SAM are reacted with metal-bearing chemical species, such as TDMAT, to form an inorganic layer, such as TiN, on the SAM.

The reactions of tetrakis(dimethylamido)titanium (TDMAT) with self assembled monolayers possessing —OH, —NH$_2$ and —CH$_3$ terminal groups have been examined in detail. The initial probability of reaction of TDMAT was found to be largest on the chemical oxide surface (starting surface to form the SAMs), and we estimate $S_{R,0}$~0.5 at Ts=−50° C. On the SAM terminated surfaces we found that reaction probabilities followed the order: —OH>—NH$_2$>—CH$_3$. In all cases the reaction probability did not vary more than a factor of 2 over the substrate temperature range examined, Ts=−50° C. to 110° C. In addition, in all cases the kinetics of adsorption, i.e. the coverage-exposure relationships, could be sufficiently well described by a first-order Langmuirian model, and the saturation coverages did not depend strongly on the substrate temperature. Angle-resolved XPS revealed that penetration of the SAMs occurred in the cases of the —OH and —CH$_3$ terminated SAMs. In particular, the apparent reactivity between TDMAT and the —CH$_3$ SAM could be completely accounted for by assuming that reaction occurred only at the SAM/SiO$_2$ interface. In contrast, concerning the —NH$_2$ terminated SAM, we found that our results from ARXPS were completely consistent with TDMAT reaction only at the terminal —NH$_2$ group. Results for the —OH SAM indicated TDMAT reactivity at the terminal —OH group and at the SAM/SiO$_2$ interface. Examination of the stoichiometry of the adlayers (i.e. the Ti:N ratio), indicated that decomposition of TDMAT and subsequent loss of ligands was significant on all surfaces, particularly for Ts≧30° C. Only on the —NH$_2$ SAM surface and at −50° C. did the molecule retain 2-3 N(CH$_3$)$_2$ ligands. On this same surface, saturation was found to correspond to one adsorbed TDMAT molecule per two SAM molecules, which is consistent with the steric limitation between TDMAT fragments expected for nearest neighbor distances of about 7-8 Å.

The present invention has utility in at least three areas. The thin film product of the reaction of a metal complex with a functionalized SAM can comprise one or more of a metal layer, a metal oxide layer, a metal nitride layer, a metal carbide layer, and combinations or "alloys" thereof, such as a binary layer or a metal oxynitride layer. For example, the reaction of a titanium-bearing complex with a SAM terminated in an amine can result in a TiN (titanium nitride) layer. In other embodiments, a titanium metal layer is produced. One area of utility of such layers is as an insulating or a metallic diffusion barrier layer useful for the manufacture of semiconductors. In semiconductor devices, for example silicon semiconductor devices, metallic interconnects are needed to assemble functional circuits. However, it is well known that certain highly conductive metals, such as copper (Cu) and aluminum (Al) diffuse rapidly in silicon. Unconstrained diffusion of metals in a silicon semiconductor device can alter the behavior of the device with time, or in more serious cases can destroy the functionality of the device entirely. The diffusion barrier layer prevents or inhibits the unwanted diffusion of the conductor metal, thereby preserving the utility of the device. In some embodiments, very thin insulating layers can be used as diffusion barrier layers even for conductive structures, in that a very thin insulator may still provide conduction by tunneling.

Another area of utility of the thin inorganic layers provided by the systems and methods of the invention is in the fabrication of devices that rely on the principles of molecular electronics. For example, in different embodiments, the methods and systems of the invention are useful for fabricating one or more electrode structures useful for making a molecular electronic device, such as a layered structure having in sequence a first contact, a self-assembled monolayer, for example comprising an active organic material as well as a functional termination, and reacting the SAM with a metal complex to form a third layer comprising a contact. In some embodiments, more than one intermediate layer situated between the two (or more) contact layers can be employed.

Still another area of utility of the thin inorganic layers provided by the systems and methods of the invention is organic light emitting diodes (hereinafter "OLEDs") and similar organic layer structures that can interact with light, for example as electrochromic, electro-optic, or opto-electronic devices. In embodiments directed to OLED applications, the systems and methods of the invention are useful to fabricate one or more layers of a structure comprising top and bottom electrical contact layers, a layer having "p-type" doping or electrical character (e.g., an excess of holes), a layer having "n-type" doping or electrical character (e.g., an excess of electrons), and in some embodiments an intrinsic layer ("i-layer") situated between the "p" and "n" layers.

The description has presented a new approach to synthesizing inorganic-organic interfaces using organo-transition metal complexes and self-assembled monolayers as organic surfaces. While the invention has been described with regard to using TDMAT as a reagent for forming a metal nitride (TiN), there is reason to believe, based on preliminary data, that similar reactions can be conducted with other titanium-bearing organometallics, and also with other metals in the form of organometallic compounds, for example, $Ti[N(CH_3C_2H_5)_2]_4$, $Ti[N(C_2H_5)_2]_4$, $Ta[N(CH_3)_2]_5$, $Ta[N(C_2H_5)_2]_3$—$N[t-C_4H_9]$, $Zr[N(CH_3)_2]_4$, $Hf[N(CH_3)_2]_4$, and $Hf[N(C_2H_5)_2]_4$. Furthermore, it is believed that yet additional organometallic compounds can participate in such reactions to form inorganic species containing those metals, including such organometallic compounds as $(C_5H_5)_2Cr$, $(C_5H_5)_3Er$, $(C_5H_5)_3Gd$, $(C_5H_5)_2Fe$, $[(CH_3)_5C_5]_2Fe$, $(C_5H_5)_2Mg$, $[(CH_3)_5C_5]Mg$, $(C_5H_5)_2Mn$, $[(CH_3)_5C_5]_2Mn$, $(C_5H_5)_2Ni$, $[(CH_3)_5C_5]_2Ni$, $(CH_3)_3(CH_3C_5H_4)Pt$, $(C_5H_5)_3Pr$, $(C_5H_5)_2Ru$, $[(CH_3)_5C_5]_2Ru$, and $(C_5H_5)_3Sm$. Given that the lanthanide rare earths and Y are similar in their chemical reactivity, if the elements Er, Gd, Pr, and Sm are expected to participate in such reactions, the analogous lanthanide rare earth (and Y) precursors, if they are available, should also be expected to undergo similar reactions and yield similar products. The transition metals Ti, V, Mn, Fe, Ni, Co, and Cu also are known to have somewhat similar chemistries, for example forming carbonyls and cyclopentadienyls, which may be capable of reacting according to the principles outlined hereinbefore. In addition, some of the precious metals, including Pt, Pd, Ru, Os, Ag, and Au may be candidates for participating in reactions to form metal-bearing inorganic layers, according to the principles outlined hereinbefore. In addition, various metals in highly reactive compounds, such as hydrides, alkyls and their derivatives, such as $AlH_3:N(CH_3)_3$ or various aluminum alkyls, may be candidates for participating in reactions to form metal-bearing inorganic layers, according to the principles outlined hereinbefore.

In addition, it is believed that the following metal-bearing chemicals may be useful in performing reactions according to principles of the invention:

For metals in periodic table Group 4 (e.g., M=Ti, Zr, Hf):
Any $M(NRR')_4$ and any oligomers $[(R'RN)_2MNR'']_n$, where R, R' and R" are any hydrogen, alkyl, aryl or $SiR(1)R(2)R(3)$ where R(1), R(2) or R(3) are any hydrogen, alkyl, aryl or silyl, N is nitrogen, and the value of n can be any integer greater than 1.

For metals in periodic table Group 5 (e.g., M=V, Nb, Ta):
Any $M(NRR')_5$ and any oligomers $[(R'RN)_3MNR'']_n$, where R, R' and R" are any hydrogen, alkyl, aryl or $SiR(1)R(2)R(3)$ where R(1), R(2) or R(3) are any hydrogen, alkyl, aryl or silyl, and N is nitrogen, and the value of n can be any integer greater than 1.

For metals in periodic table Group 6 (M=Cr, Mo, W):
Any $M(NRR')q$, where q=3, 4, or 5, any $[M(NRR')_3]_2$, any $[(R'RN)_4MNR'']$, and any $(R'RN)_2M(NR'')_2$, where R, R' and R" are any hydrogen, alkyl, aryl or $SiR(1)R(2)R(3)$ where R(1), R(2) or R(3) are any hydrogen, alkyl, aryl or silyl, and N is nitrogen.

While the present invention has been particularly shown and described with reference to the structure and methods disclosed herein and as illustrated in the drawings, it is not confined to the details set forth and this invention is intended to cover any modifications and changes as may come within the scope and spirit of the following claims.

What is claimed is:

1. A method of making a self-assembled monolayer having an inorganic-organic interface, comprising the steps of:
   providing a substrate having a surface;
   reacting said substrate surface with a precursor organic molecular species to form a self-assembled monolayer of said organic molecular species on said substrate, said organic molecular species when attached to said surface having an end proximal to said surface and an end distal to said surface; and
   reacting at said distal end at least a portion of said self assembled monolayer of said
   organic molecular species with a reagent comprising a transition metal and nitrogen;
   whereby a self-assembled monolayer comprising an organic moiety and a metal nitride surface is produced.

2. The method of making a self-assembled monolayer having an inorganic organic interface of claim 1, wherein said precursor organic molecular species is in solution.

3. The method of making a self-assembled monolayer having an inorganic-organic interface of claim 1, wherein said precursor organic molecular species is in a vapor phase.

4. The method of making a self-assembled monolayer having an inorganic-organic interface of claim 1, wherein said substrate is a silicon substrate.

5. The method of making a self-assembled monolayer having an inorganic-organic interface of claim 1, further comprising the optional step of treating said surface of said substrate to provide a surface having a desired chemical composition.

6. The method of making a self-assembled monolayer having an inorganic-organic interface of claim 5, wherein said surface having a desired chemical composition is an oxide surface.

7. The method of making a self-assembled monolayer having an inorganic-organic interface of claim 1, further comprising the optional step of reacting at least some of said self-assembled monolayer of said organic molecular species with a reagent to provide a desired terminal group on said distal end of said at least some of said organic molecular species.

8. The method of making a self-assembled monolayer having an inorganic-organic interface of claim 7, wherein said optional reaction step comprises forming a terminal —OH, —NH$_2$, or —CH$_3$ group on said distal end of said at least some of said organic molecular species.

9. The method of making a self-assembled monolayer having an inorganic-organic interface of claim 8, wherein said optional reaction step comprises forming a terminal —OH on said distal end of said at least some of said organic molecular species by providing a vinyl-terminated precursor that is treated with hydroboration followed by oxidation.

10. The method of making a self-assembled monolayer having an inorganic-organic interface of claim 8, wherein said optional reaction step comprises forming a terminal —NH$_2$ on said distal end of said at least some of said organic molecular species by providing a —CN-terminated precursor that is treated with hydroboration followed by reduction.

11. The method of making a self-assembled monolayer having an inorganic-organic interface of claim 7, wherein said optional reaction step comprises forming a terminal group selected from a carboxylic acid, a mercapto group, an ester, an aldehyde, and a nitro group on said distal end of said at least some of said organic molecular species.

* * * * *